United States Patent

Fujii et al.

(10) Patent No.: US 9,111,732 B2
(45) Date of Patent: Aug. 18, 2015

(54) SPUTTERING METHOD AND APPARATUS

(75) Inventors: Takamichi Fujii, Kanagawa (JP);
Takayuki Naono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1155 days.

(21) Appl. No.: 12/197,902

(22) Filed: Aug. 25, 2008

(65) Prior Publication Data

US 2009/0057135 A1 Mar. 5, 2009

(30) Foreign Application Priority Data

Aug. 31, 2007 (JP) .................................. 2007-225826

(51) Int. Cl.
| | |
|---|---|
| C23C 14/00 | (2006.01) |
| H01J 37/34 | (2006.01) |
| B41J 2/16 | (2006.01) |
| C23C 14/08 | (2006.01) |
| H01L 41/316 | (2013.01) |

(52) U.S. Cl.
CPC .................. *H01J 37/34* (2013.01); *B41J 2/161* (2013.01); *B41J 2/1646* (2013.01); *C23C 14/088* (2013.01); *H01J 37/3444* (2013.01); *H01L 41/316* (2013.01)

(58) Field of Classification Search
CPC ...................................................... C23C 14/088
USPC ............. 204/192.13, 298.03, 298.15, 298.08, 204/192.18
See application file for complete search history.

(56) References Cited

U.S. PATENT DOCUMENTS

| | | | | |
|---|---|---|---|---|
| 2,878,680 A | * | 3/1959 | Schmidt ........................ | 74/10 R |
| 3,617,459 A | * | 11/1971 | Logan ...................... | 204/192.23 |
| 4,131,533 A | * | 12/1978 | Bialko et al. ............. | 204/298.14 |
| 5,092,978 A | | 3/1992 | Kojima et al. | |
| 5,198,090 A | | 3/1993 | Galicki et al. | |
| 6,533,906 B2 | * | 3/2003 | Kawakubo et al. ...... | 204/192.22 |
| 2002/0195332 A1 | * | 12/2002 | Burton et al. ............ | 204/192.13 |
| 2005/0145479 A1 | * | 7/2005 | Karlsson .................. | 204/192.16 |
| 2006/0231526 A1 | * | 10/2006 | Donohue ........................ | 216/61 |
| 2007/0138906 A1 | | 6/2007 | Tsukamoto | |
| 2008/0236493 A1 | * | 10/2008 | Sakao ........................ | 118/723.1 |

FOREIGN PATENT DOCUMENTS

| | | |
|---|---|---|
| JP | 06-145972 A | 5/1994 |
| JP | 7-109562 A | 4/1995 |
| JP | 9-176850 A | 7/1997 |
| JP | 2002-129320 A | 5/2002 |
| JP | 2006-265651 A | 10/2006 |

* cited by examiner

*Primary Examiner* — John Brayton
(74) *Attorney, Agent, or Firm* — Birch, Stewart, Kolasch & Birch, LLP

(57) ABSTRACT

The sputtering apparatus includes a vacuum vessel, a sputter electrode placed within the vacuum vessel to hold a target material to be sputtered, a radio frequency power source for applying radio frequency waves to the electrode, a substrate holder which is spaced from the electrode and on which a substrate is held, a thin film being to be deposited on the substrate from components of the target material, and an impedance adjusting circuit for adjusting a first impedance of the substrate holder. The impedance adjusting circuit has a first end directly set at a ground potential and has an impedance circuit which is adjustable for adjusting the first impedance, a second impedance of the impedance circuit is adjusted to thereby adjust the first impedance and, hence, a potential of the substrate.

5 Claims, 12 Drawing Sheets

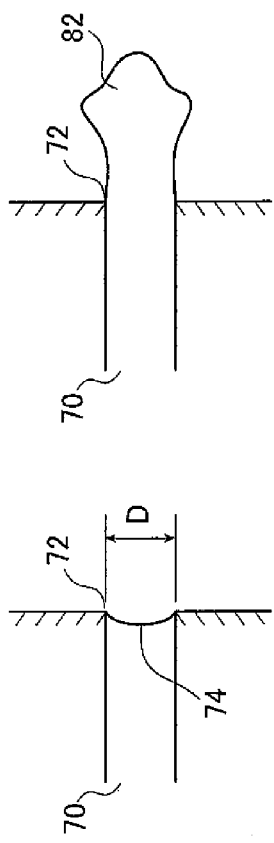
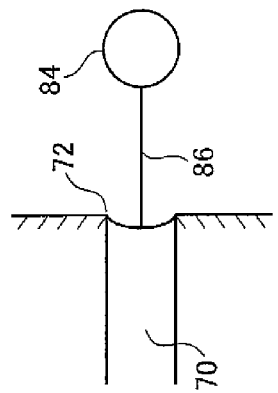
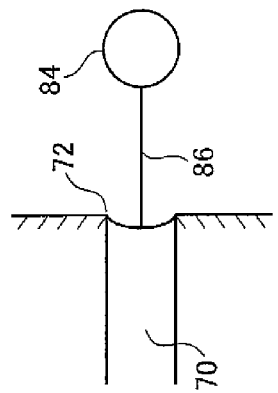
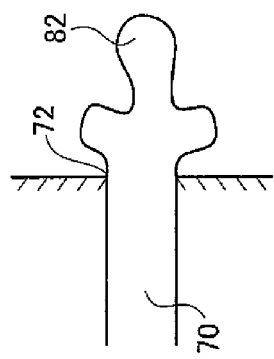
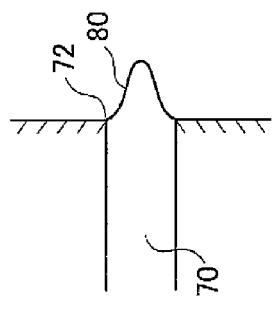

SPUTTERING METHOD AND APPARATUS

BACKGROUND OF THE INVENTION

This invention relates to a sputtering apparatus and method, more particularly to a sputtering apparatus that deposits films by plasma-enhanced vapor-phase growth techniques, a sputtering method that uses the apparatus to deposit thin films such as insulating films (insulators) or dielectric films (dielectrics), insulating films or dielectric films such as piezoelectric films that are deposited by such sputtering apparatus and method, as well as piezoelectric devices that use the piezoelectric films, and an ink-jet apparatus that is equipped with the piezoelectric devices.

Conventionally, thin films such as piezoelectric films, insulating films and dielectric films are deposited by the sputtering method that deposits films by plasma-enhanced vapor-phase growth techniques or a sputtering apparatus that uses this method. In such sputtering method and apparatus, high-energy Ar ions or other plasma ions that are produced by plasma discharge in high vacuum are allowed to collide with a target, whereupon the constituent elements of the target are released and vapor-deposited on a surface of a substrate to form a thin film on it.

In the sputtering method and apparatus, in order to ensure the formation of thin films of good quality, sputtering is performed with a predetermined potential being applied to a surface of a substrate that is held on a substrate electrode positioned in a face-to-face relationship with a sputter electrode placed within a vacuum vessel (see, for example, JP 06-145972 A and JP 2002-129320 A).

The bias sputtering method and apparatus that are described in JP 06-145972 A are designed to form films of high quality by controlling the incident energy of positive ions that strike the substrate and in one example, the sputter electrode connected to a plasma generating RF power source is spaced from the substrate electrode connected to a DC power source or a RF power source for applying a positive bias, with a third electrode being inserted to surround the plasma discharge space between the sputter and substrate electrodes, and a target material is placed on a surface of the third electrode with a negative DC voltage being applied to the same.

In another example that is described in JP 06-145972 A, the substrate electrode is connected to a DC power source for applying a biasing DC voltage whereas the sputter electrode is connected to a RF power source and a DC power source, and a DC voltage smaller than a threshold for sputtering the target material and a DC voltage greater than that threshold are applied alternately by an alternately applying means and the circuit constant of a matching circuit (matching box) for the RF power source is varied in synchronism with a change in the DC voltage by a matching circuit control means.

In yet another example, the sputter electrode is connected to a REF power source whereas the substrate electrode is connected to a DC power source that applies a DC voltage and, in addition, the floating potential of the plasma discharge space is detected by a floating potential detection means or the value of an electric current flowing through the substrate is detected by a RF current detection means provided between the substrate electrode and the DC power source, with the DC voltage on the substrate electrode being controlled by a substrate potential control means on the basis of the detected floating potential or current value.

In the sputtering method and apparatus described in JP 2002-129320 A, a technique is proposed to prevent electrostatic breakdown of a thin film during sputtering; a target connected to a sputter power source for applying a plasma-generating negative voltage is spaced from a substrate on a wafer stage connected to a bias power source which is an AC power source for applying a biasing desired voltage, for example, a negative voltage or an AC voltage, and a control electrode is provided laterally with respect to the sputter space between the target and the substrate, which is then set at a floating potential and the control electrode is supplied with a control voltage that adjusts the potential of the substrate to approximately zero volts as sputtering is performed.

SUMMARY OF THE INVENTION

Problems with the bias sputtering method and apparatus that are described in JP 06-145972 A are that in all cases that are proposed, the substrate electrode is connected to a DC or AC power source for applying a predetermined potential to a surface of the substrate and, what is more, the third electrode, or the alternately applying means and the matching circuit control means, or the floating potential detection means or the RF current detection means in combination with the substrate potential control means must be provided, which inevitably adds to the complexity of the apparatus design or the way it is controlled.

There is a further problem with the invention described in JP 06-145972 A in which the incident energy of positive ions that strike the substrate is controlled in order to form films of high quality; to apply bias to the substrate, a DC or an AC power source is employed but this results in occasional failure to set a substrate potential that best matches the film deposition conditions that are necessary to form a film of the required high quality and, what is more, the substrate potential cannot be adjusted or controlled as appropriate or in a suitable manner in accordance with a change in the film deposition environment within the vacuum vessel or depending upon the properties of the film being deposited or the desired degree of reproducibility.

In the sputtering method and apparatus that are described in JP 2002-129320 A, a film can be deposited with a voltage being applied to the control electrode in such a way as to adjust the substrate potential to zero volts but, on the other hand, the bias power source which is an AC power source for applying a negative voltage or an AC voltage must be connected to the substrate holding wafer stage and, what is more, the control electrode for adjusting the substrate potential to zero volts must be provided laterally with respect to the sputter space and this again adds to the complexity of the apparatus design or the way it is controlled, as in the case of the invention described in JP 06-145972 A.

Another problem with the invention described in JP 2002-129320 A results from the fact that in order to prevent electrostatic breakdown of a thin film during sputtering, the RF power source is used as a bias power source for applying bias to the substrate whereas the voltage on the control electrode is so controlled as to adjust the substrate potential to zero volts; since prevention of electrostatic breakdown is the only consideration that is given, it is impossible to set a substrate potential that best matches the film deposition conditions that are necessary to form a film of the required high quality and, what is more, the substrate potential cannot be adjusted or controlled as appropriate or in a suitable manner in accordance with a change in the film deposition environment within the vacuum vessel or depending upon the properties of the film being deposited or the desired degree of reproducibility.

As further problems, if thin films such as piezoelectric films, insulating films or conductor films are to be deposited by those sputtering methods and apparatuses which are complex enough in the apparatus design or the way it is controlled, the production cost is high or there occurs performance variation or yield drop, which will eventually lead to higher costs or lower performance of devices such as piezoelectric devices that use the thin films or ink-jet heads that use devices such as those piezoelectric devices.

An object of the present invention is to solve the aforementioned problems of the prior art by providing a sputtering apparatus that requires a simple design and control to control the energy of a plasma during film deposition by sputtering and maintain the substrate potential at a predetermined floating potential, whereby back sputtering is prevented to ensure that a film of higher quality is obtained, that compositional offset is controlled and that film deposition is performed with higher reproducibility, with the result that thin films such as piezoelectric films, insulating films or conductor films can be deposited in consistent and good quality, namely, in high quality and without suffering variations in film quality.

Another object of the present invention is to provide a sputtering method that may be used to operate the above-described apparatus.

A further object of the present invention is to provide an insulating film or a dielectric film that are deposited by the above-described sputtering apparatus or method and which are of high quality in the absence of variations in film quality and compositional offsets, in particular, a piezoelectric film that comprises Pb-containing perovskite oxides such as PZT, which results from stable growth of perovskite crystals with a smaller content of the pyrochlore phase, and which yet is characterized in that Pb loss is suppressed consistently.

A still further object of the present invention is to provide a piezoelectric device that uses the piezoelectric film.

Yet another object of the present invention is to provide an ink-jet head that is equipped with the piezoelectric device.

In order to attain the above-mentioned objects by providing thin films such as piezoelectric films, insulating films or conductor films of high quality and without suffering variations in film quality, the present inventors investigated many prior art techniques including those described in JP 06-145972 A and JP 2002-129320 A and conducted intensive studies on sputtering methods and apparatuses that could deposit such thin films of high quality; as a result, they have obtained the following observations.

First of all, it should be noted that both of the inventions described in JP 06-145972 A and JP 2002-129320 A are designed to enhance the energy of ions that are to strike the substrate and no consideration is made from the viewpoint of attenuating the ionic energy.

Although not described and hence left entirely out of consideration in those prior art technologies, the dimensions of the apparatus and the substrate have substantial effects on the substrate potential and it is advisable to include the dimensions of the substrate as a design factor.

What is more, the substrate installed in common sputtering apparatuses is either at the ground potential or at a floating potential. In the case of a floating potential, it may be floating in DC applications but in AC applications (13.56 MHz), a certain amount of impedance develops and it is advisable that this impedance be deliberately controlled in view of the properties of the film being deposited or the desired degree of reproducibility.

Consider the case of applying a bias to the substrate. If the substrate or the material from which a film is to be deposited is made of an electrical conductor, a DC bias can be applied but no bias can be applied if they are an insulator. In addition, a negative (−) bias can be applied using radio frequency waves but the potential of the substrate cannot be controlled to have a positive (+) value.

From the foregoing, the present inventors have found the following: if the plasma energy during film deposition by the sputtering process is unduly high, the film being deposited will be subjected to a greater stress or some materials may undergo selective back sputtering, which leads to compositional offsets. This necessitates a method of controlling the energy of the plasma; in addition, if an insulating film is deposited, it will adhere to the anode part, whereupon the plasma condition changes to yield a film having different quality than is desired. One possible factor that changes the film quality is a change in the potential of the substrate. The present inventors have found that by monitoring and maintaining the potential of the substrate, the reproducibility of film deposition can be improved.

The present invention has been accomplished on the basis of these findings.

In order to achieve the first object, a first aspect of the present invention provides a sputtering apparatus comprising:

a vacuum vessel;

a sputter electrode placed within the vacuum vessel to hold a target material to be sputtered;

a radio frequency power source connected to the sputter electrode for applying radio frequency waves to the sputter electrode;

a substrate holder which is spaced from the sputter electrode and placed in a face-to-face relationship with the sputter electrode within the vacuum vessel and on which a substrate is held, a thin film being to be deposited on the substrate from-components of the target material; and an impedance adjusting circuit for adjusting a first impedance of the substrate holder, the impedance adjusting circuit having a first end directly set at a ground potential and having an impedance circuit which is adjustable for adjusting the first impedance of the substrate holder, a second impedance of the impedance circuit in the impedance adjusting circuit being adjusted to thereby adjust the first impedance of the substrate holder and, hence, a potential of the substrate.

A second end of the impedance adjusting circuit opposite to the first end is preferably connected to the substrate holder.

The second end of the impedance adjusting circuit is preferably connected to a side wall of the vacuum vessel which supports the substrate holder.

Preferably, the impedance adjusting circuit further comprises a detector circuit which is connected to the impedance circuit and measures a DC component of a potential difference between the potential of the substrate and the ground potential.

Preferably, the sputtering apparatus further comprises means for displaying a result of detection with the detector circuit in the impedance adjusting circuit.

Preferably, the sputtering apparatus further comprises means for informing of when to clean inside the vacuum vessel based on the result of detection with the detector circuit in the impedance adjusting circuit.

Preferably, the impedance adjusting circuit further comprises adjusting means which is provided outside the vacuum vessel and adjusts the second impedance of the impedance circuit.

A distance between the target material held on the sputter electrode and the substrate held on the substrate holder is preferably 10 cm or smaller.

The distance is preferably 2 cm or greater.

The thin film is preferably an insulating film or a dielectric film.

The thin film is preferably a piezoelectric film.

In order to achieve the second object, a second aspect of the present invention provides a sputtering method comprising the steps of:

holding a target material to be sputtered on a sputter electrode placed within a vacuum vessel and also holding a substrate on a substrate holder placed within the vacuum vessel in a face-to-face relationship with the sputter electrode; and applying radio frequency waves to the sputter electrode from a radio frequency power source connected to the sputter electrode, whereby the target material is sputtered to form a thin film on a surface of the substrate from components of the target material, wherein a DC component of a potential difference between a substrate potential of the substrate and a ground potential is measured with an impedance adjusting circuit one end of which is directly set at the ground potential and a result of measurement is monitored, whereas a first impedance of the substrate holder is adjusted with the impedance adjusting circuit so as to adjust the substrate potential for depositing the thin film on the surface of the substrate.

It is preferred for the DC component of the potential difference between the substrate potential of the substrate and the ground potential to be measured with a detector circuit connected to an impedance circuit and for the first impedance of the substrate holder to be adjusted by adjusting a second impedance of the impedance circuit in the impedance adjusting circuit by an external adjusting means depending upon a result of detection of the DC component with the detector circuit.

A distance between the target material held on the sputter electrode and the substrate held on the substrate holder is preferably 10 cm or smaller.

The distance is preferably 2 cm or greater.

The thin film is preferably an insulating film or a dielectric film.

The thin film is preferably a piezoelectric film.

In order to achieve the third object, a third aspect of the present invention provides a piezoelectric film as deposited on a substrate with the sputtering apparatus according to the first aspect or by the sputtering method according to the second aspect.

In order to achieve the fourth object, a fourth aspect of the present invention provides a piezoelectric device comprising the piezoelectric film according to the third aspect and electrodes for applying an electric field to the piezoelectric film.

In order to achieve the fifth object, a fifth aspect of the present invention provides an ink-jet head comprising:

the piezoelectric device according to the fourth aspect;

an ink storing and ejecting member comprising an ink reservoir for storing ink and an ink orifice through which the ink is ejected from the ink reservoir to outside; and a diaphragm provided between the piezoelectric device and the ink storing and ejecting member.

The film deposition by the sputtering method of the present invention involves depositing a film, or a thin film, by plasma-enhanced vapor-phase growth techniques and is characterized by determining the conditions of film deposition based on the relation among the film deposition temperature Ts (° C.), Vs−Vf (V) which is the difference between the plasma potential Vs (V) in the plasma and the floating potential Vf (V) during film deposition, and the characteristics of the film being deposited.

The film deposition temperature Ts (° C.) shall mean the temperature at the center of the substrate on which a film is being formed. The plasma potential Vs and the floating potential Vf shall be measured by the single probe method using a Langmuir probe. To measure the floating potential Vf, the tip of the probe shall be placed in the neighborhood of the substrate (about 10 mm away from it) but to ensure that the film being deposited and other materials will not introduce errors by adhering to the probe, the measurement shall be kept to a minimum length of time. The value of Vs−Vf (V) which is the difference between the plasma potential Vs and the floating potential Vf can be directly converted to the electron temperature (eV). An electron temperature of 1 eV is equivalent to an absolute temperature of 11600 K.

The film deposition method of the present invention can be applied in depositing films by plasma-enhanced vapor-phase growth techniques. Films that can be formed by applying the film deposition method of the present invention include insulating films, dielectric films, and piezoelectric films.

The film deposition method of the present invention can also be applied with preference in depositing piezoelectric films (which may contain incidental impurities) that are made of one or more perovskite oxides. Piezoelectric films made of perovskite oxides are ferroelectric films that exhibit spontaneous polarization with no voltage applied.

If the film deposition method of the present invention is to be applied in depositing piezoelectric films (which may contain incidental impurities) that are made of one or more perovskite oxides which are represented by the following general formula (P), the conditions of film deposition are preferably determined to lie within a range that satisfies the following relations (1) and (2), and it is particularly preferred to determine the conditions of film deposition to lie within a range that satisfies the following relations (1) to (3):

$$A_a B_b O_3 \qquad (P)$$

(where A is an element at site A which is at least one member of the group including Pb; B is an element at site B which is at least one member selected from the group consisting of Ti, Zr, V, Nb, Ta, Cr, Mo, W, Mn, Sc, Co, Cu, In, Sn, Ga, Zn, Cd, Fe, Ni, and lanthanides; O is an oxygen atom; a and b which are each typically 1.0 may depart from 1.0 to such an extent that the perovskite structure can be assumed);

$$Ts(° C.) \geq 400 \qquad (1)$$

$$-0.2Ts+100 < Vs-Vf(V) < -0.2Ts+130 \qquad (2)$$

$$10 \leq Vs-Vf(V) \leq 35 \qquad (3)$$

The piezoelectric film of the present invention is one (which may contain incidental impurities) that is made of one or more perovskite oxides represented by the above general formula (P) and which is deposited by plasma-enhanced vapor-phase growth techniques; it is characterized by being deposited under conditions of film deposition that satisfy the above-quoted relations (1) and (2). The piezoelectric film of the present invention is preferably deposited under conditions of film deposition that satisfy the above-quoted relations (1) to (3).

The present invention can also be applied preferably to PZT represented by the following general formula (P-1) or derivatives thereof having substitutions at site B, as well as mixed crystals thereof:

$$Pb_a(Zr_{b1}Ti_{b2}X_{b3})O_3 \qquad (P-1)$$

(where X is at least one metal element selected from the group consisting of group V and VI elements; a>0, b1>0, b2>0, b3≥0; a and b1+b2+b3 which are each typically 1.0 may depart from 1.0 to such an extent that the perovskite structure can be assumed).

According to the present invention, there can be provided piezoelectric films with 1.0≤a, preferably 1.0≤a≤1.3, that are free from Pb loss.

The piezoelectric device of the present invention is characterized by comprising the above-described piezoelectric film and electrodes for applying an electric field to the piezoelectric film. The liquid ejecting apparatus (ink-jet head) of the present invention is characterized by comprising the above-described piezoelectric device and a liquid storing and ejecting member which comprises a liquid reservoir for storing a liquid and a liquid orifice through which the liquid is ejected from the liquid reservoir to the outside.

According to the first and second aspects of the present invention, there can be provided a system that requires a simple design and control to control the energy of a plasma during film deposition by sputtering and maintain the substrate potential at a predetermined floating potential, whereby back sputtering is prevented to ensure that a film of higher quality is obtained, that compositional offset is controlled and that film deposition is performed with higher reproducibility. As a result, according to those aspects, thin films such as piezoelectric films, insulating films or conductor films can be deposited in consistent and good quality, namely, in high quality and without suffering variations in film quality.

According to the third aspect of the present invention, there can be obtained insulating films or dielectric films of high quality in the absence of variations in film quality and compositional offsets and, in particular, there can be obtained piezoelectric films that comprise Pb-containing perovskite oxides such as PZT, which result from stable growth of perovskite crystals with a smaller content of the pyrochlore phase, and which yet are characterized in that Pb loss is suppressed consistently.

According to the fourth and fifth aspects of the present invention, there can be obtained a piezoelectric device that uses the piezoelectric film, as well as an ink-jet head that is equipped with the piezoelectric device.

The film deposition method of the present invention is so designed that the conditions of film deposition are determined based on the relation between the above-mentioned two factors that affect the film characteristics and the characteristics of the film deposited; as a result, films of good quality can be deposited consistently by plasma-enhanced vapor-phase growth techniques such as sputtering. Consequently, the film deposition method of the present invention can preferably be applied in depositing thin films such as piezoelectric films.

When applied in depositing piezoelectric films made of perovskite oxides, the film deposition method of the present invention enables consistent growth of perovskite crystals with a smaller content of the pyrochlore phase. According to the present invention, there can be obtained piezoelectric films that comprise Pb-containing perovskite oxides such as PZT, which result from stable growth of perovskite crystals with a smaller content of the pyrochlore phase, and which yet are characterized in that Pb loss is suppressed consistently.

BRIEF DESCRIPTION OF THE DRAWINGS

FIGS. 11A to 11E are schematic diagrams showing an example of the ejection of ink from an orifice in the ejecting portion in response to a multipulse waveform;

DETAILED DESCRIPTION OF THE INVENTION

On the following pages, a sputtering apparatus according to the first aspect of the present invention, a sputtering method according to the second aspect, a thin film according to the third aspect, such as an insulating film or a dielectric film, in particular, a piezoelectric film that is deposited using the sputtering apparatus and the sputtering method, a piezoelectric device according to the fourth aspect that uses the piezoelectric film, and an ink-jet apparatus according to the fifth aspect that is equipped with the piezoelectric device are described in detail with reference to the advantageous embodiments that are shown in the accompanying drawings.

Figure 1:
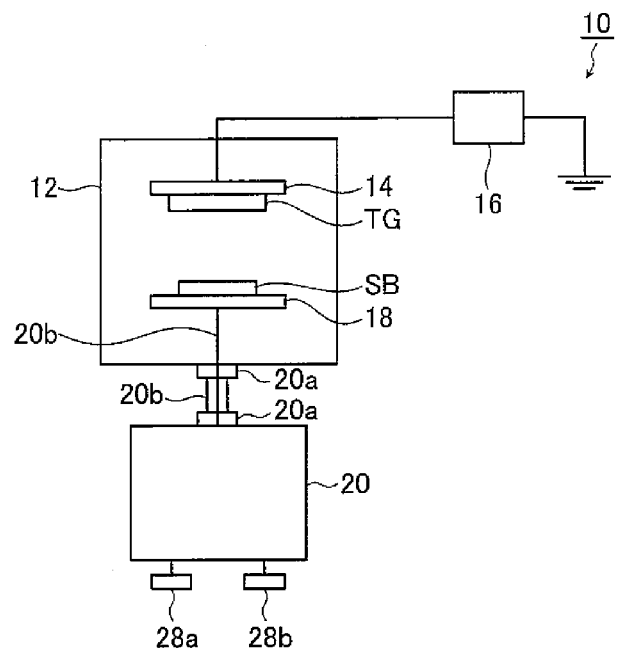
FIG. 1 is a simplified diagram showing in concept an embodiment of a sputtering apparatus that implements the sputtering method of the present invention.
Figure 2:
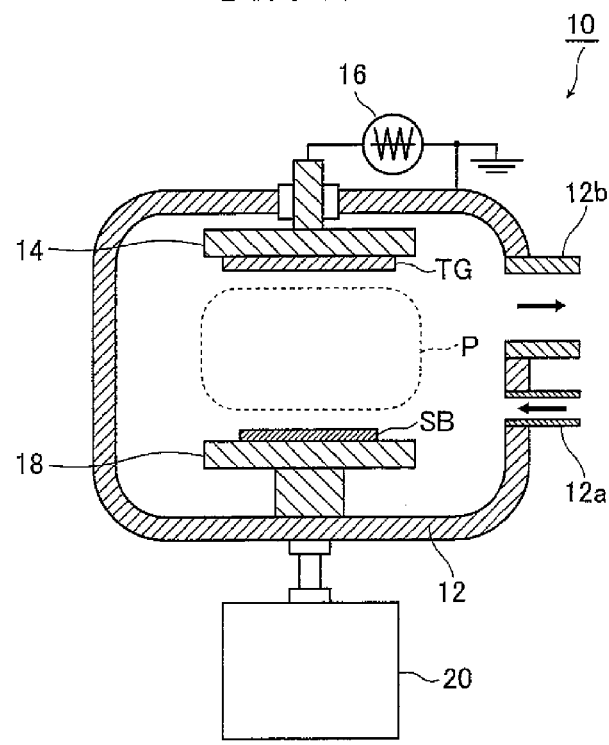
FIG. 2 is a diagrammatic sectional view showing the system layout of the sputtering apparatus shown in FIG. 1.
Figure 3:
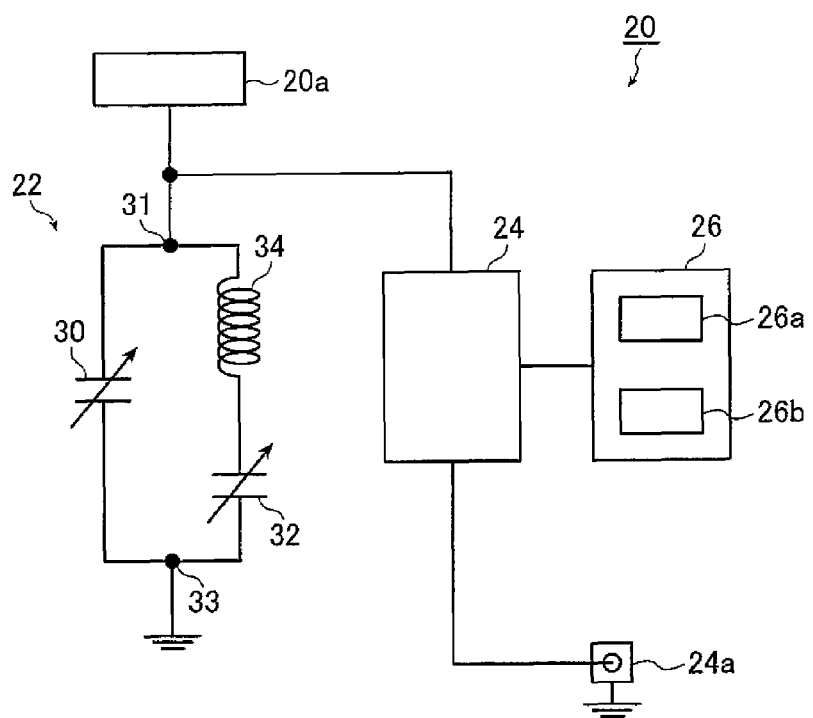
FIG. 3 is a schematic circuit diagram showing an example of an impedance adjuster connected to the substrate holder in the sputtering apparatus shown in FIG. 1.

FIG. 1 is a simplified diagram showing in concept an embodiment of a sputtering apparatus that implements the sputtering method of the present invention; FIG. 2 is a diagrammatic sectional view showing the system layout of the sputtering apparatus shown in FIG. 1; and FIG. 3 is a schematic circuit diagram of an impedance adjuster connected to the substrate holder in the sputtering apparatus shown in FIG. 1.

The following description assumes as a typical case a sputtering apparatus that deposits a piezoelectric film as a thin film to fabricate a piezoelectric device as a thin-film device but it should of course be understood that the present invention is by no means limited to this particular case.

As shown in FIGS. 1 and 2, the sputtering apparatus of the present invention which is generally indicated by 10 is an RF sputtering apparatus for depositing a thin film such as an insulating film or a dielectric film, in particular, a piezoelectric film, namely, an apparatus that deposits a thin film such as a piezoelectric film by a plasma-enhanced vapor-phase growth technique (sputtering) on a substrate SB to fabricate a thin-film device such as a piezoelectric device; the apparatus 10 comprises a vacuum vessel 12 having a gas supply pipe 12a and a gas exhaust pipe 12b (see FIG. 2 for both pipes), a sputter electrode (cathode electrode) 14 provided within the vacuum vessel 12 to hold a target material TG to be sputtered for generating a plasma, an RF power source 16 that is connected to the sputter electrode 14 and which applies radio frequency waves to it, a substrate holder 18 that is provided within the vacuum vessel 12 at a position in a face-to-face relationship with the sputter electrode 14 and which holds the substrate SE on which a thin film is to be deposited from the components of the target material TG, and an impedance adjusting circuit 20 that is connected to the substrate holder 18 and which adjusts its impedance.

The vacuum vessel 12 is a highly hermetic vessel that is formed of iron, stainless steel, aluminum or the like to maintain a predetermined degree of vacuum for sputtering; in the illustrated case, the vacuum vessel 12 is grounded and equipped with the gas supply pipe 12a for supplying its interior with a gas or gases that are required for film deposition and with the gas exhaust pipe 12b for discharging gases from within the vacuum vessel 12. Examples of the gas that may be introduced into the vacuum vessel 12 through the gas supply pipe 12a include argon (Ar) and a mixture of argon (Ar) and oxygen ($O_2$) gases. The gas supply pipe 12a is connected to a supply source (not shown) of such gases. The gas exhaust pipe 12b is connected to a degassing means such as a vacuum pump for two purposes, one for maintaining a predetermined degree of vacuum within the vacuum vessel 12, and the other for discharging gases from within the vacuum vessel 12 in order to maintain the predetermined degree of vacuum during film deposition.

The vacuum vessel 12 may be of various types that are employed in sputtering apparatuses, including a vacuum chamber, a bell jar, and a vacuum tank.

The sputter electrode 14 is placed in an upper position within the vacuum vessel 12 and it has the target material TG mounted and held on its surface (facing down in FIG. 2); the target material TG has a composition that fits with the composition of a thin film such as a piezoelectric film to be deposited; the sputter electrode 14 is connected to the REF power source 16.

The RF power source 16 serves to supply the sputter electrode 14 with a sufficient RF power (negative radio frequency waves) to make a plasma of a gas such as Ar that has been introduced into the vacuum vessel 12; one end of the RF power source 16 is connected to the sputter electrode 14 and the other end is grounded. Note that the RF power to be applied from the RE power source 16 to the sputter electrode 14 is not limited to any particular value and it may be exemplified by a RF power of 13.65 MHz up to 5 kW or 1 kW; ranges of RF power that are preferably used include, for example, 50 kHz–2 MHz, 27.12 MHz, 40.68 MHz, 60 MHz and 1 kW–10 kW.

When the sputter electrode 14 is supplied with an RF power (negative radio frequency waves) from the RF power source 16, discharge occurs, whereupon a gas such as Ar that has been introduced into the vacuum vessel 12 forms a plasma to generate positive ions such as Ar ion. Hence, the sputter electrode 14 may also be called a cathode electrode or a plasma electrode.

The thus generated positive ions sputter the target material TG held on the sputter electrode 14. The constituent elements of the target material TG thus sputtered with the positive ions are released from the target material TG and vapor-deposited, in either a neutral or ionized state, on the substrate SB held on the substrate holder 18 placed in a face-to-face relationship with the sputter electrode 14.

In this way, as shown by a dashed line in FIG. 2, there is formed a plasma space P within the vacuum vessel 12 that contains positive ions such as Ar ion, the constituent elements of the target material TG, and ions of such elements.

The substrate holder 18 is placed in a lower position within the vacuum vessel 12 that is spaced from and in a face-to-face relationship with the sputter electrode 14; it serves to hold the substrate SB, namely to support it from beneath as seen in FIG. 2, on which the constituent elements (components) of the target material TG held on the sputter electrode 14 are to be vapor-deposited, whereupon a thin film such as a piezoelectric film is deposited. Note that the substrate holder 18 is equipped with a heater (not shown) for heating and maintaining the substrate SB at a predetermined temperature during film deposition on the substrate SB.

It should further be noted here that the sputtering apparatus 10 of the present invention has an essential requirement to meet, which states to the effect that the substrate SB should not be at the ground potential; to this end, the apparatus 10 must be of such a design that the substrate SB held on the substrate holder 18 is not at the ground potential. In other words, the sputtering apparatus 10 needs to be of such a design that the potential of the substrate SB and, hence, the substrate holder 18 is a floating potential.

Assume here that the area of the target material TSG is written as St whereas the area of that portion of the substrate holder 18 in a face-to-face relationship with TG which functions as an anode electrode and which is at the ground potential is written as Sa; for the purposes of the present invention, Sa/St is preferably not more than 3. This is because as the area of the portion that is at the ground potential increases, the effect of adjusting the impedance of that portion which is at a floating potential by means of the impedance adjusting circuit 20 diminishes.

It should also be noted that the size of the substrate SB to be mounted on the substrate holder 18 is not limited to any particular value and it may be a substrate with an ordinary size of 6 inches or it may be a substrate with a size of 5 or 8 inches; it may even be a substrate with a size of 5 cm by square.

The target-to-substrate distance, or the distance between the target material TG held on the sputter electrode 14 and the substrate SB held on the substrate holder 18, is preferably 10 cm (100 mm) or smaller, more preferably 8 cm (80 mm) or smaller, and even more preferably 6 cm (60 mm) or smaller. This is because if the target material TG is too much spaced from the substrate SB, the impedance adjusting circuit 20 is less effective in adjusting the impedance of the substrate SB.

The lower limit of the distance between the target material TG and the substrate SE is not particularly critical if a plasma generating discharge is to occur; however, if the distance is unduly small, no discharge will occur, so it is preferably at least 20 cm.

It should be noted here that if the target material TG and the substrate SB are sufficiently thin, the distance between the sputter electrode 14 and the substrate holder 18 can be used as a representative value of the distance between the target material TG and the substrate SB.

The impedance adjusting circuit 20 is the most characteristic part of the present invention and serves to adjust the impedance of the substrate holder 18. Being provided outside the vacuum vessel 10, the impedance adjusting circuit 20 has one of its ends set directly at the ground potential and the other end connected to the substrate holder 18 via an fN connector 20a.

As shown in FIG. 3, the impedance adjusting circuit 20 comprises an adjustable impedance circuit 22 for adjusting the impedance of the substrate holder 18, a detector circuit 24 that is connected to the impedance circuit 22 and which measures the DC component ($V_{dc}$) of the difference between the potential of the substrate SB and the ground potential, a display unit 26 for displaying the result of detection by the detector circuit 24, and control knobs 28a and 28b for adjusting the impedance of the impedance circuit 22; either the control knob 28a or 28b or both are turned to adjust the impedance of the impedance circuit 22 and, hence, the impedance of the substrate holder 18.

As also shown in FIG. 3, the impedance circuit 22 typically comprises vacuum variable capacitors capable of variation in electrical capacity (electrostatic capacity) and has a first variable capacitor 30 and a second variable capacitor 32 that are connected in parallel to each other, and a coil 34 connected in series to the second variable capacitor 32. Here one end of the first variable capacitor 30 is connected to one end of the parallel-connected coil 34, with the junction 31 being connected to the substrate holder 18 within the vacuum vessel 12 via the connector 20a such as the EN connector and a coaxial cable 20b, and via a connector 20a and the coaxial cable 20b that are mounted on the vacuum vessel 12. The other end of the coil 34 is connected in series to one end of the second variable capacitor 32. The other end of the second variable capacitor 32 is connected to the other end of the parallel-connected first variable capacitor 30, with the junction 33 being grounded.

The first variable capacitor 30 and the second variable capacitor 32 are fitted with the control knobs 28a and 28b, respectively, which are turned to change the electrostatic capacities of the first variable capacitor 30 and the second variable capacitor 32, respectively, whereby the impedance of the impedance circuit 22 is varied.

One end of the detector circuit 24 is connected to a node between the junction 31 and the EN connector 20a whereas the other end of the detector circuit 24 is grounded via a connector 24a such as a BNC connector.

Thusly configured, the detector circuit 24 measures and detects the potential (DC component $V_{dc}$) at the junction 31 of the impedance circuit 22 to eventually measure the DC component ($V_{dc}$) of the difference between the potential of the substrate SB and the ground potential. Note that the detector circuit 24 is not limited in any particular way as long as it is capable of measuring the potential at the junction 31 of the impedance circuit 22 and any conventionally known potential detector circuit may be employed.

It should also be noted here that the detector circuit 24 may not be built in, but may be externally connected to, the impedance adjusting circuit 20; if desired, it may be connected to the impedance circuit 22 only at the time of measuring the potential of the substrate SB; it may even be of a type that measures the potential of the substrate SB without being connected to the impedance adjusting circuit 20; alternatively, it may be of a type that directly measures the substrate potential with a probe or the like.

The display unit 26 is where the results of measurement and detection with the detector circuit 24 are displayed for monitoring purposes and it comprises a substrate potential display section 26a for displaying the measured potential of the substrate SB and a cleaning time display section 26b which, on the basis of the measured potential of the substrate SB, calculates the amounts or degrees in which constituent elements of the target material TG have adhered to the inner wall surfaces of the vacuum vessel 12 and displays the time to clean the interior of the vacuum vessel 12.

It should be noted here that the display unit 26 may be provided as an integral part of the detector circuit 24; alternatively, it may be a separate part from the detector circuit 24, to which it is connected only at the time the results of measurement and detection with the detector circuit 24 are to be monitored. Needless to say, the display unit 26 may be designed in the same way as the detector circuit 24 in terms of whether it should be built in the impedance adjusting circuit 20 or how it should be connected to the impedance circuit 22.

The substrate potential display section 26a of the display unit 26 is where the result of measurement of the potential of the substrate SB with the detector circuit 24 during film deposition is displayed for monitoring purposes; to this end, a potential of the substrate SB that is suitable for depositing a piezoelectric film of a predetermined composition or a range of such substrate potential is determined preliminarily in accordance with the composition of the piezoelectric film to be deposited or its film species and if the potential of the substrate SB that is displayed on the substrate potential display section 26a gets close to either limit of a predetermined range or deviates from that range, the operator, while monitoring the potential of the substrate SB displayed on the substrate potential display section 26a, turns either the control knob 28a or 28b or both in the impedance adjusting circuit 20 to thereby adjust the capacity of either the first variable capacitor 30 or the second variable capacitor 32 or both in the impedance circuit 22, whereupon the impedance of the impedance circuit 22 is adjusted, which in turn adjusts the impedance of the substrate holder 18 and, hence, the substrate SB held on it, until the potential of the substrate SB is properly adjusted to lie within the predetermined range. In this way, the potential of the substrate SB during film deposition is brought to an appropriate value and, as the result, the potential of the plasma in the plasma space P within the vacuum vessel 12 during film deposition can be adjusted to a level that is suitable for depositing thin films such as a piezoelectric film.

In the case of depositing a piezoelectric film, it is preferably deposited with the impedance circuit 22 being adjusted in such a way that the potential of the substrate SB is maintained at 10 volts or more, preferably at 20 volts or more.

Aside from displaying the substrate potential on it, the substrate potential display section 26 may be so designed that if the displayed substrate potential gets close to either limit of the predetermined range or deviates from that range, it is supplied with a warning display or an audible announcement or warning.

In the case where it displays the time to clean, the cleaning time display section 26b may be so designed that the amounts or degrees in which the constituent elements of the target material TG have adhered to the inner wall surfaces of the vacuum vessel 12, as well as the amount by which the impedance of the impedance circuit 22 needs to be adjusted and other parameters are determined preliminarily in accordance with the film species and the like of the thin film being deposited such as a piezoelectric film and if the time to clean is approached or reached, it displays the time to clean the interior of the vacuum vessel 12. In this case, too, the cleaning time display section 26b may be supplied with an audible announcement or warning.

In the case described above, the vacuum vessel 12 is grounded so that the substrate holder 18 is electrically "floating" and its impedance is adjusted by means of the impedance adjusting circuit 20; however, this is not the sole case of the present invention and two alternatives may be adopted; in one alternative case, a covering material is employed to support the substrate holder 18 as it is electrically connected to the latter and covers the inner wall surfaces of the vacuum vessel 12 and this covering material is made electrically "floating" together with the substrate holder 18 and its impedance is adjusted with the impedance adjusting circuit 20 to thereby adjust the impedance of the substrate holder 18; in the other alternative case, the substrate holder 18 is electrically connected to the vacuum vessel 12 so that not only the substrate holder 18 but also the vacuum vessel 12 is made electrically "floating" and the impedance of the inner wall surfaces of the vacuum vessel 12 is adjusted with the impedance adjusting circuit 20 to thereby adjust the impedance of the substrate holder 18.

The sputtering apparatus of the present invention is basically constructed as shown above and on the following pages, we will describe its operation and the sputtering method of the present invention.

Figure 4:
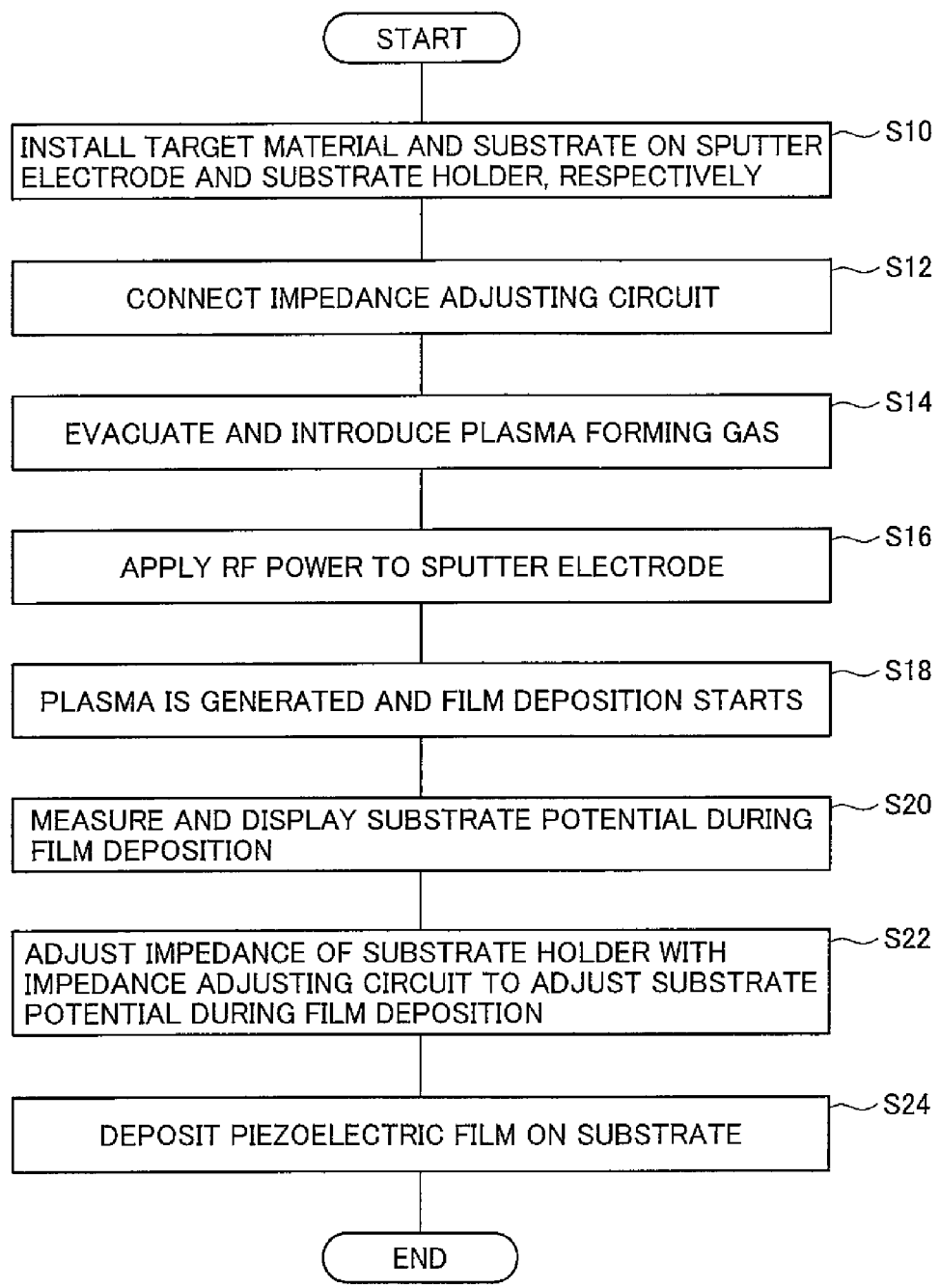
FIG. 4 is a flowchart depicting an embodiment of the sputtering method of the present invention.

FIG. 4 is a flowchart depicting an embodiment of the sputtering method of the present invention.

As FIG. 4 shows, the flowchart starts with step S10 in which the sputtering apparatus 10 shown in FIGS. 1 to 3 is so conditioned that a target material TG to be sputtered is mounted and held on the sputter electrode 14 provided within the vacuum vessel 12 while, at the same time, a substrate on which to deposit a thin film such as a piezoelectric film is mounted and held on the substrate holder 18 within the vacuum vessel as it is spaced apart from and placed in a face-to-face relationship with the sputter electrode 14.

Next, in step S12, the impedance adjusting circuit 20 is connected to the substrate holder 18 to establish such a condition that the impedance of the substrate holder 18 can be adjusted to enable measurement of the potential of the substrate SB held on the substrate holder 18.

Thereafter, in step S14, the vacuum vessel 12 is degassed through the gas exhaust pipe 12*b* until a predetermined degree of vacuum is created in its interior and with continued degassing to maintain the predetermined degree of vacuum, a plasma forming gas such as argon gas (Ar) is kept supplied in a predetermined quantity through the gas supply pipe 12*a*. Simultaneously with this step, step S16 is performed in which radio frequency waves (a negative RF power) is applied from the RF power source 16 to the sputter electrode 14, whereupon discharge occurs to make a plasma of the gas such as Ar that has been introduced into the vacuum vessel 12 and positive ions such as Ar ion are generated to form a plasma space P.

Then, in step S18, the positive ions within the thus formed plasma space P sputter the target material TG held on the sputter electrode 14 and the constituent elements of the sputtered target material TG are released from the target material TG and vapor-deposited, in either a neutral or ionized state, on the substrate SB held on the substrate holder 18 that is spaced apart from and placed in a face-to-face relationship with the sputter electrode 14; this starts the process of film deposition.

Subsequently, in step S20, the substrate potential (DC component) of the substrate SB is measured with the detector circuit 24 in the impedance adjusting circuit 20 during film formation and displayed on the substrate potential display section 26*a* of the display unit 26.

Subsequently, the operator, while monitoring the potential of the substrate SB displayed on the substrate potential display section 26*a*, turns either the control knob 28*a* or 28*b* or both in the impedance adjusting circuit 20 to thereby adjust the capacity of either the first variable capacitor 30 or the second variable capacitor 32 or both in the impedance circuit 22, whereupon the impedance of the substrate holder 18 in the vacuum vessel 12 is adjusted until the potential of the substrate SB is adjusted to lie within the predetermined range. In this way, the potential of the substrate SB during film deposition is brought to an appropriate value and, as the result, the potential of the plasma in the plasma space P within the vacuum vessel 12 during film deposition can be adjusted to a level that is suitable for depositing thin films such as a piezoelectric film.

As a result, the energy of the plasma during film deposition is controlled and the substrate potential is maintained at a predetermined floating potential, whereby back sputtering is prevented to ensure that a film of higher quality is obtained, that compositional offset is controlled and that film deposition is performed with higher reproducibility, with the result that thin films such as piezoelectric films can be deposited in consistent and good quality, namely, in high quality and without suffering variations in film quality (step S24).

Note here that as already mentioned above, the potential of the substrate SB is adjusted by adjusting the impedance of the substrate holder 18 within the vacuum vessel 12 with the impedance adjusting circuit 20; it is recommended that before implementing the sputtering method of the present invention, sputtering be effected without adjustment by the impedance adjusting circuit 20 in order to determine preliminarily the relation between the characteristics of a thin film such as a piezoelectric film that is deposited and the potential of the substrate SB, thereby determining the range over which the potential of the substrate SB can be adjusted as well as the range over which the impedance of the substrate holder 18 can be adjusted to provide the desired film characteristics.

As described above, the present invention is characterized by adjusting the film quality in accordance with the substrate potential as adjusted by impedance adjustment with the impedance adjuster and, needless to say, this technique is applicable with advantage not only to processes such as sputtering like the sputtering apparatus and method of the present invention but also to all processes that employ a plasma such as plasma etching and CVD, and apparatuses that implement those processes using a plasma.

In the next place, we describe other conditions for film deposition that are preferably used to deposit films by the sputtering method of the present invention in the case of adjusting the potential of the substrate SB through adjustment of the impedance of the substrate holder 18 with the impedance adjusting circuit 20.

The conditions of film deposition by the sputtering method of the present invention are preferably determined based on the relation among the film deposition temperature Ts (° C.), Vs−Vf (V) which is the difference between the plasma potential Vs (V) in the plasma and the floating potential Vf (V) of the substrate during film deposition, and the characteristics of the film being deposited.

The film characteristics to be related to Ts and Vs−Vf may be exemplified by the crystal structure of the film and/or its composition.

Figure 5:
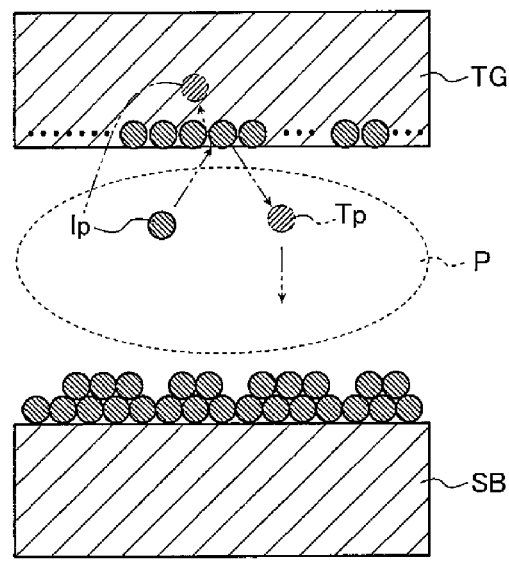
FIG. 5 is a diagram showing schematically how a film is deposited in the sputtering apparatus shown in FIGS. 1 and 2.

FIG. 5 is a diagram showing schematically how a film is deposited in the sputtering apparatus shown in FIGS. 1 and 2.

As shown schematically in FIG. 5, a gas introduced into the vacuum vessel 12 turns to a plasma as the result of discharge that occurs at the sputter electrode 14, whereupon positive ions Ip such as Ar ion are generated to create a plasma space P between the sputter electrode 14 and the substrate holder 18, namely, between the target material TG held on the sputter electrode 14 and the substrate SB held on the substrate holder 18. The generated positive ions Ip sputter the target material TG. The constituent elements Tp of the target material TG sputtered with the positive ions Ip are released from the target material TG and vapor-deposited, in either a neutral or ionized state, on the substrate SB.

The potential of the plasma space P is the plasma potential Vs (V). In the present invention, the substrate SB is typically an insulator and electrically insulated from the ground. Therefore, the substrate SB is "floating" and its potential is the floating potential Vf (V). The constituent elements Tp of the target material TG, as they occur between the target material TG and the substrate SB, are assumed to collide with the substrate SB in the process of film deposition, possessing a kinetic energy equivalent to the accelerating voltage of Vs−Vf which is the difference between the potential of the plasma space P and that of the substrate SB.

Figure 6:
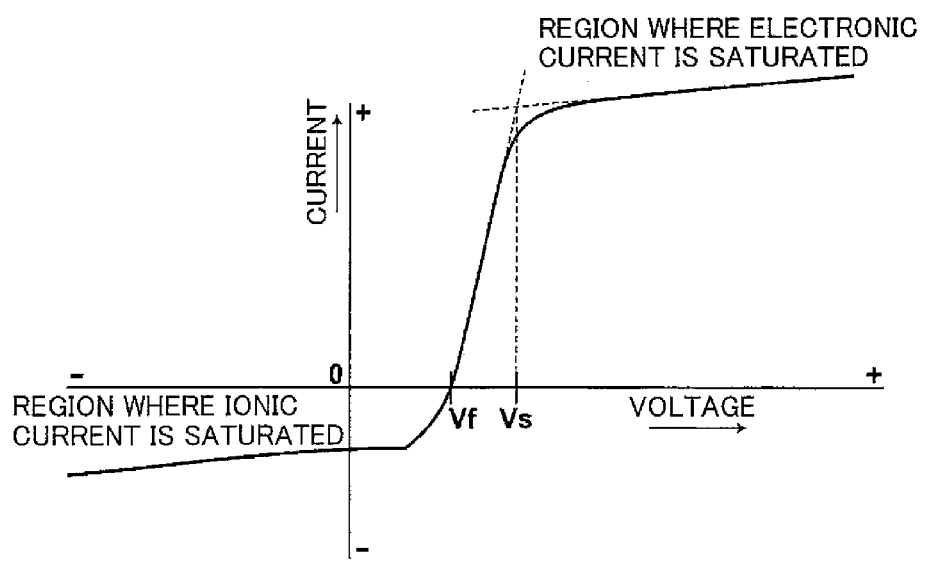
FIG. 6 is an illustration that shows how the plasma potential Vs and the floating potential Vf are measured in the sputtering apparatus.

The plasma potential Vs and the floating potential Vf can be measured with a Langmuir probe. Insert the tip of a Langmuir probe into the plasma P and apply a varying voltage to the probe, whereupon one obtains a current vs. voltage characteristic curve as shown in FIG. 6 (*Purazuma to seimaku no kiso* (Fundamentals of Plasma and Film Deposition) by Mitsuharu Konuma, p. 90, THE NIKKAN KOGYO SHIMBUN, LTD.) In FIG. 6, the floating potential Vf is the probe potential at which no current flows. This is the point at which the ionic current and the electronic current flow to the probe surface in equal amounts. It is this floating potential that is exhibited by metal surfaces or substrate surfaces if they are insulated. As the probe voltage becomes higher than the floating potential Vf, the ionic current gradually decreases until it becomes zero and only the electronic current reaches the probe. The voltage at this transition point is the plasma potential Vs.

The potential difference Vs−Vf between the plasma space P and the substrate SB may be varied by, for example, providing the ground between the substrate SB and the target material TG; in the present invention, however, this can be varied by adjusting the impedance of the substrate holder 18 and, hence, the floating potential Vf which is the potential of the substrate SB.

Factors that may influence the characteristics of films to be deposited by plasma-enhanced sputtering include: the film deposition temperature, the type of the substrate, the composition of any previously deposited film on the substrate, the surface energy of the substrate, the film deposition pressure, the amount of oxygen in the environmental gas, the power applied, the substrate-target distance, the electronic temperature and density in the plasma, as well as the active species density and life in the plasma.

The present inventors have found that among the many factors in film deposition, the film deposition temperature Ts and the potential difference Vs−Vf are critical to the characteristics of the film to be deposited and they have also found that films of good quality can be deposited by controlling those factors to appropriate values. To be more specific, the present inventors have found that films of good quality can be deposited within a certain range of a film characteristics profile when the film deposition temperature Ts is plotted on the horizontal axis and the potential difference Vs−Vf on the vertical axis (see FIG. 19).

As already shown, the potential difference Vs−Vf correlates with the kinetic energy of the constituent elements Tp from the target material TG that collide with the substrate SB. As the following equation shows, the kinetic energy E is generally represented by a function of temperature T, so it may be assumed that the potential difference Vs−Vf has the same effect on the substrate SB as the temperature has:

$$E = \tfrac{1}{2}mv^2 = 3/2\, kT$$

(where m is the mass, v is the velocity, k is a constant, and T is the absolute temperature.)

In addition to the temperature-like effect, the potential difference Vs−Vf is assumed to have such effects as promoting surface migration and etching weakly bonded portions.

JP 2004-119703 A proposes that in the process of depositing a piezoelectric film by sputtering, a bias be applied to the substrate in order to relax the tensile stress on the piezoelectric film. Applying a bias to the substrate means varying the amount of energy of the constituent elements from the target by which the substrate is bombarded. However, JP 2004-119703 A refers to neither the plasma potential Vs nor the potential difference Vs−Vf which is the difference between the plasma potential Vs and the floating potential Vf.

With conventional sputtering and other film depositing apparatuses, the potential difference Vs−Vf as between the plasma space P and the substrate SB is virtually determined by the apparatus design and cannot be largely varied, so there has been little motivation to change the potential difference Vs−Vf. JP 10-60653 A, although it does not concern a sputtering method, discloses controlling the potential difference Vs−Vf to lie within a specified range when an amorphous silicon film or the like is to be deposited by RF plasma-enhanced CVD. In that invention, the potential difference Vs−Vf is controlled to lie within the specified range in order to prevent it from becoming uneven on the substrate surface. However, JP 10-60653 A is silent about determining the conditions of film deposition on the basis of the relation between the film deposition temperature Ts, the potential difference Vs−Vf, and the characteristics of the film to be deposited.

The film deposition method under discussion is applicable to any kind of films that can be deposited by sputtering or other plasma-enhanced vapor-phase growth techniques. The films to which the film deposition method of the present invention can be applied include insulating films, dielectric films, and piezoelectric films.

The film deposition method of the present invention can also be applied with preference in depositing piezoelectric films (which may contain incidental impurities) that are made of one or more perovskite oxides. Piezoelectric films made of perovskite oxides are ferroelectric films that exhibit spontaneous polarization with no voltage applied.

The present inventors have found that if the film deposition method of the present invention is to be applied in depositing piezoelectric films that are made of one or more perovskite oxides which are represented by the following general formula (P), the conditions of film deposition are preferably determined in such a way that the following relations (1) and (2) are satisfied (see FIG. 19):

$$A_a B_b O_3 \qquad (P)$$

(where A is an element at site A which is at least one member of the group including Pb; B is an element at site B which is at least one member selected from the group consisting of Ti, Zr, V, Nb, Ta, Cr, Mo, W, Mn, Sc, Co, Cu, In, Sn, Ga, Zn, Cd, Fe, Ni, and lanthanides; O is an oxygen atom; a and b which are each typically 1.0 may depart from 1.0 to such an extent that the perovskite structure can be assumed);

$$Ts(°\,C.) \geq 400 \qquad (1)$$

$$-0.2Ts+100 < Vs-Vf(V) < -0.2Ts+130 \qquad (2)$$

Examples of the perovskite oxides that are represented by the above general formula (P) include lead-containing compounds such as lead titanate, lead zirconate titanate (PZT), lead zirconate, lead lanthanum titanate, lead lanthanum zirconate titanate, lead magnesium niobate zirconium titanate, and lead nickel niobate zirconium titanate, and non-lead-containing compounds such as barium titanate, bismuth sodium titanate, bismuth potassium titanate, sodium niobate, potassium niobate, and lithium niobate. Piezoelectric films may be mixed crystal systems of perovskite oxides represented by the above general formula (P).

The present invention can preferably be applied to PZT represented by the following general formula (P-1) or derivatives thereof having substitutions at site B, as well as mixed crystals thereof:

$$Pb_a(Zr_{b1}Ti_{b2}X_{b3})O_3 \qquad (P-1)$$

(where X is at least one metal element selected from the group consisting of group V and VI elements; a>0, b1>0, b2>0, b3≥0; a and b1+b2+b3 which are each typically 1.0 may depart from 1.0 to such an extent that the perovskite structure can be assumed).

Perovskite oxides represented by the above general formula (P-1) are lead zirconate titanate (PZT) when $b_3$32 0, and when $b_3$>0, they are oxides in which site B in PZT is partly substituted by X which is at least one metal element selected from the group consisting of group V and VI elements.

In addition, X may be any metal element of group VA, group VB, group VIA, or group VIB, and it is preferably at least one member selected from the group consisting of V, Nb, Ta, Cr, Mo, and W.

Figure 19:
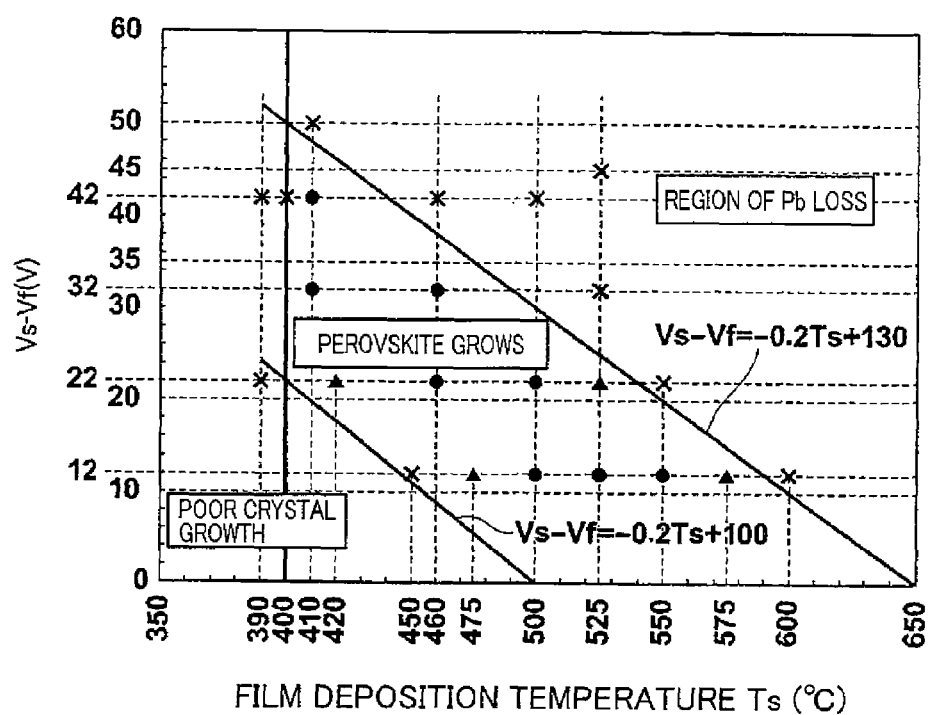
FIG. 19 is a graph showing the results of XRD measurements on all samples of EXAMPLES 3 to 5, with the horizontal axis plotting the film deposition temperature Ts and the vertical axis plotting the potential difference Vs−Vf.

The present inventors have found that in the case of depositing piezoelectric films that are made of perovskite oxides represented by the above general formula (P), the film deposition condition of Ts (° C.)<400 which does not satisfy the above-mentioned relation (1) involves such a low film deposition temperature that perovskite crystals will not grow satisfactorily but that instead a pyrochlore-phase rich film is deposited (see FIG. 19).

The present inventors have further found that in the case of depositing piezoelectric films that are made of perovskite oxides represented by the above general formula (P), the condition of Ts (° C.)≥400 which satisfies the above-mentioned relation (1) assures that by determining such a film deposition condition that the film deposition temperature Ts and the potential difference Vs–Vf satisfy the above-mentioned relation (2), pyrochlore-phase lean perovskite crystals can be grown consistently and yet Pb loss can be suppressed consistently to achieve consistent deposition of piezoelectric films of good quality that are satisfactory in terms of crystal structure and film composition (see FIG. 19).

It has been known that PZT film deposition by sputtering tends to suffer Pb loss if the film deposition temperature is unduly high (see FIG. 2 of JP 6-49638 A). The present inventors have found that Pb loss depends not only on the film deposition temperature but also on the potential difference Vs–Vf. Among Pb, Zr and Ti that are the constituent elements of PZT, Pb has the highest sputtering yield and is most easily sputtered. For example, according to Table 8.1.7 in *Shinku Handobukku* (Handbook of Vacuum Technology) (ed. by ULVAC, Inc. and published by Ohmsha, Ltd.), the sputtering yield under the condition of a 300 eV Ar ion is 0.75 for Pb, 0.48 for Zr, and 0.65 for Ti. Easy sputtering means that sputtered atoms, after being deposited on a substrate surface, can be easily re-sputtered. The greater the difference between the plasma potential and the substrate potential, namely, the larger the value of Vs–Vf, the higher the chance of re-sputtering and the more likely it is for Pb loss to occur. This is also true with Pb-containing perovskite oxides other than PZT, and so are plasma-enhanced vapor-phase growth techniques other than sputtering.

If each of the film deposition temperature Ts and the potential difference Vs–Vf is unduly small, the tendency is against satisfactory growth of perovskite crystals. If either the film deposition temperature Ts or the potential difference Vs–Vf or both are excessive, there is a greater tendency for Pb loss to occur.

In other words, given the condition of Ts (° C.)≥400 which satisfies the above-mentioned relation (1) and if the film deposition temperature Ts is relatively low, the potential difference Vs–Vf needs to be relatively high in order to ensure that perovskite crystals will grow satisfactorily but if the film deposition temperature Ts is relatively high, the potential difference Vs–Vf needs to be relatively low in order to suppress Pb loss. These conditions are expressed by the above-mentioned relation (2).

The present inventors have found when depositing piezoelectric films that are made of perovskite oxides which are represented by the above-mentioned general formula (P), piezoelectric films having high piezoelectric constants can be obtained by determining the conditions of film deposition in such a way that the following relations (1) to (3) are satisfied:

$$Ts(° C.) \geq 400 \qquad (1)$$

$$-0.2Ts+100 < Vs-Vf(V) < -0.2Ts+130 \qquad (2)$$

$$10 \leq Vs-Vf(V) \leq 35 \qquad (3)$$

The present inventors have found that when depositing piezoelectric films that are made of perovskite oxides which are represented by the above-mentioned general formula (P), perovskite crystals free from Pb loss can be grown under the film deposition temperature condition of Ts (° C.)=ca. 420 by adjusting the potential difference Vs–Vf (V) to about 42 volts but then the piezoelectric constant $d_{31}$ of the obtained film is as low as about 100 pm/V. Under this condition, the potential difference Vs–Vf, or the energies of the constituent elements Tp from the target material TG that collide with the substrate, are so high that defects may easily develop in the film to lower its piezoelectric constants. The present inventors have found that piezoelectric films with $d_{31} \geq 130$ pm/V can be deposited by determining the film deposition conditions in such a way that the above-mentioned relations (1) to (3) are satisfied.

The present inventors have revealed that in plasma-enhanced vapor-phase growth techniques such as the sputtering method of the present invention, the film deposition temperature Ts (° C.) and Vs–Vf (V) which is the difference between the plasma potential Vs (V) in the plasma and the floating potential Vf (V) during film deposition are two factors that affect the characteristics of the film obtained.

The film deposition method of the present invention is so designed that the conditions of film deposition are determined based on the relation between the above-mentioned two factors that affect the film characteristics and the characteristics of the film deposited; as a result, films of good quality can be deposited consistently by plasma-enhanced vapor-phase growth techniques such as sputtering.

By adopting the film deposition method of the present invention, one can easily identify conditions that enable films of good quality to be deposited even if the apparatus conditions are changed and, as a result, films of good quality can be deposited consistently.

The film deposition by the sputtering method of the present invention can preferably be applied in depositing thin films such as piezoelectric films. When applied in depositing piezoelectric films made of perovskite oxides, the film deposition method of the present invention enables consistent growth of perovskite crystals with a smaller content of the pyrochlore phase. According to the present invention, there can be obtained piezoelectric films that comprise Pb-containing perovskite oxides such as PZT, which result from stable growth of perovskite crystals with a smaller content of the pyrochlore phase, and which yet are characterized in that Pb loss is suppressed consistently.

By applying the above-described film deposition method, the following piezoelectric films of the present invention can be provided.

To be more specific, the piezoelectric films of the present invention are ones that are made of one or more perovskite oxides represented by the following general formula (P) and which have been deposited by plasma-enhanced vapor-phase growth techniques such as the sputtering method of the present invention under the conditions of film deposition that satisfy the following relations (1) and (2):

$$A_aB_bO_3 \quad (P)$$

(where A is an element at site A which is at least one member of the group including Pb; B is an element at site B which is at least one member selected from the group consisting of Ti, Zr, V, Nb, Ta, Cr, Mo, W, Mn, So, Co, Cu, In, Sn, Ga, Zn, Cd, Fe, Ni, and lanthanides; O is an oxygen atom; a and b which are each typically 1.0 may depart from 1.0 to such an extent that the perovskite structure can be assumed);

$$Ts(° C.) \geq 400 \quad (1)$$

$$-0.2Ts+100 < Vs - Vf(V) < -0.2Ts+130 \quad (2)$$

According to the present invention, there can be consistently provided piezoelectric films of good quality with satisfactory crystal structure and film composition that have a perovskite crystal structure with a smaller content of the pyrochlore phase and which yet are suppressed in Pb loss.

According to the present invention, there can also be provided piezoelectric films with $1.0 \leq a$ that have a Pb-loss free composition, and it is also possible to provide piezoelectric films with $1.0 < a$ that have a Pb-rich composition. There is no particular upper limit of a and the present inventors have found that piezoelectric films of satisfactory piezoelectric performance can be obtained if $1.0 \leq a \leq 1.3$.

The piezoelectric films of the present invention are preferably ones that have been deposited under the conditions of film deposition that satisfy the following relations (1) to (3). If these conditions are employed, piezoelectric films having high piezoelectric constants can be provided.

$$Ts(° C.) \geq 400 \quad (1)$$

$$-0.2Ts+100 < Vs - Vf(V) < -0.2Ts+130 \quad (2)$$

$$10 \leq Vs - Vf(V) \leq 35 \quad (3)$$

The thus obtained piezoelectric films of the present invention are insulating films or dielectric films of high quality in the absence of variations in film quality and compositional offsets and, in particular, they are piezoelectric films that comprise Pb-containing perovskite oxides such as PZT, which result from stable growth of perovskite crystals with a smaller content of the pyrochlore phase and which yet are characterized in that Pb loss is suppressed consistently; such films can be utilized as a piezoelectric device suitable for use in ink-jet heads and the like.

Described on the foregoing pages is the basic structure of thins films such as piezoelectric films, insulating films and dielectric films according to the present invention.

Figure 7:
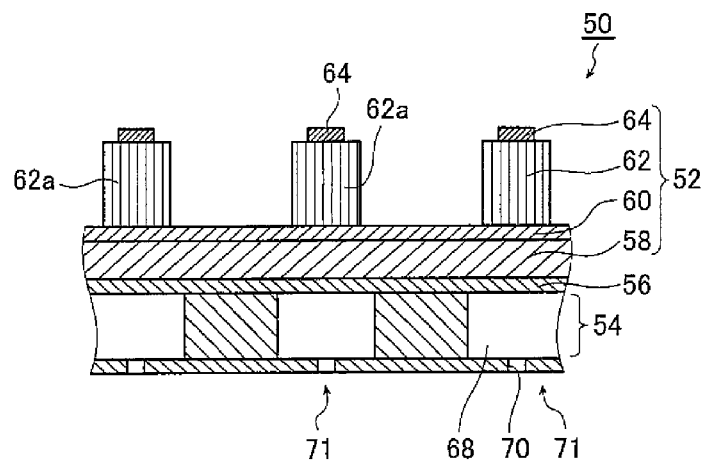
FIG. 7 is a sectional view showing the structure of an embodiment of the piezoelectric device of the present invention and an ink-jet head that uses it.

We next describe the construction of the piezoelectric device according to the present invention and the ink-jet head equipped with that piezoelectric device. FIG. 7 is a sectional view showing the essential parts of an embodiment of an ink-jet head that uses an embodiment of the piezoelectric device of the present invention (as seen through the thickness of the piezoelectric device). To facilitate viewing, the individual components of the apparatus are not to scale.

As shown in FIG. 7, the ink-jet head of the present invention which is generally indicated by 50 comprises a piezoelectric device 52 according to the present invention, an ink storing/ejecting member 54, and a diaphragm 56 provided between the piezoelectric device 52 and the ink storing/ejecting member 54.

First, the piezoelectric device of the present invention is described. As shown in FIG. 7, the piezoelectric device 52 is a device comprising a substrate 58 on which a lower electrode 60, a piezoelectric film 62 and an upper electrode 64 are superposed in that order; the piezoelectric device 52 is so designed that the lower electrode 60 and the upper electrode 64 apply an electric field to the piezoelectric film 62 in the direction of its thickness.

The substrate 58 is not limited in any particular way and may be exemplified by such substrate materials as silicon, glass, stainless steel (SUS), yttrium-stabilized zirconia (YSZ), alumina, sapphire, and silicon carbide. If desired, a laminated substrate such as an SOI substrate having an oxide ($SiO_2$) film formed on a surface of a silicon substrate may be used as the substrate 58.

The lower electrode 60 is formed to cover generally the entire surface of the substrate 58 and on top of it is formed a striped pattern of piezoelectric film 62 that consists of linear stripes of high spot 62a that extend into the paper on which FIG. 7 is drawn, with the upper electrode 64 being formed on top of each of the high spots 62a.

The pattern of the piezoelectric film 62 is not limited to the illustrated case and may be designed as appropriate. The piezoelectric film 62 may be continuous; however, by forming the piezoelectric film 62 not as a continuous layer but in a pattern that consists of a plurality of discrete high spots 62a, the individual high spots 62a will expand or contract smoothly enough to produce a greater amount of displacement, which is preferred for the purpose of the present invention.

The main components of the lower electrode 60 are not limited in any particular way and include metals or metal oxides such as Au, Pt, Ir, $IrO_2$, $RuO_2$, $LaNiO_3$, and $SrRuO_3$, and combinations thereof.

The main components of the upper electrode 64 are not limited in any particular way and include the materials listed as examples of the material of the lower electrode 60, as well as electrode materials like Al, Ta, Cr and Cu that are commonly used in semiconductor processes, and combinations of these materials.

The piezoelectric film 62 is a film that has been deposited by the above-described sputter-based film deposition method of the present invention. The piezoelectric film 62 is preferably one that is made of a perovskite oxide represented by the above-noted general formula (P).

The lower electrode 60 and the upper electrode 64 may each have a thickness of about 200 nm. The thickness of the piezoelectric film 62 is not limited in any particular way and may typically be 1 µm or more, say, between 1 and 5 µm.

The ink-jet head 50 shown in FIG. 7 generally comprises the piezoelectric device 52 of the above-described structure having the ink storing/ejecting member 54 fitted on the lower side of the substrate 58 with the diaphragm 56 interposed; the ink storing/ejecting member 54 has ink storing compartments (ink reservoirs) 68 and ink orifices (nozzles) 70 through which ink is ejected from the ink reservoirs 68 to the outside. The number of ink reservoirs 68 is determined by the number of high spots 62a in the piezoelectric film 62 and the pattern they form. To be more specific, the ink-jet head 50 has a plurality of ejecting portions 71, and the piezoelectric film 62, the upper electrode 64, the ink compartment 68 and the ink nozzle 70 are provided for each ejecting portion 71. On the other hand, the lower electrode 60, the substrate 58 and the diaphragm 56 are provided as elements that are common to the plurality of ejecting portions 71; however, this is not the sole case of the present invention and they may be provided for every ejecting portion or a group of two or more ejecting portions.

The ink-jet head 50 may be driven by a preferred method that is described below or by any conventional known method so that the strength of electric field being applied to the high spots 62a in the piezoelectric film 62 is adjusted for each of those high spots 62a to either expand or contract, thereby controlling ink ejection, for example, the amount in which the ink is ejected from the individual ink reservoirs 68.

Described above are the basic structures of the piezoelectric device according to an embodiment of the present invention and the ink-jet head that employs this piezoelectric device.

In the next place, the drive method that may be applied to the ink-jet head of the present invention is described with reference to FIGS. 8 to 11E. While the ink-jet head of the present invention is preferably driven by the method described below, this is not the sole case of the present invention and it may of course be driven by any conventional known method.

Figure 8:
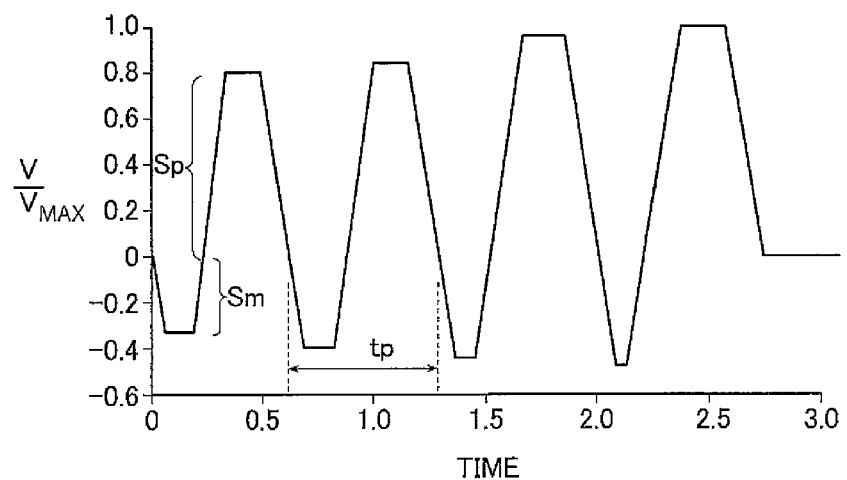
FIG. 8 is a graph showing an exemplary bipolar waveform for driving the ink-jet head shown in FIG. 7.
Figure 9:
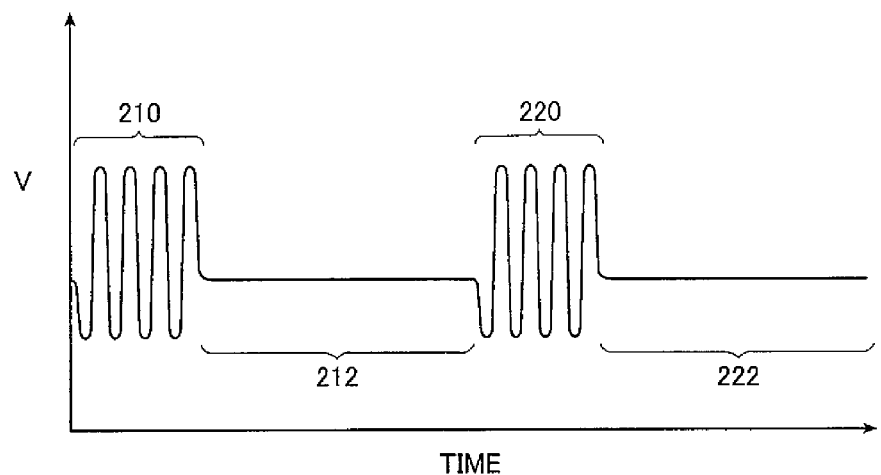
FIG. 9 is a graph showing an exemplary unipolar waveform for driving the ink-jet head shown in FIG. 7.
Figure 10:
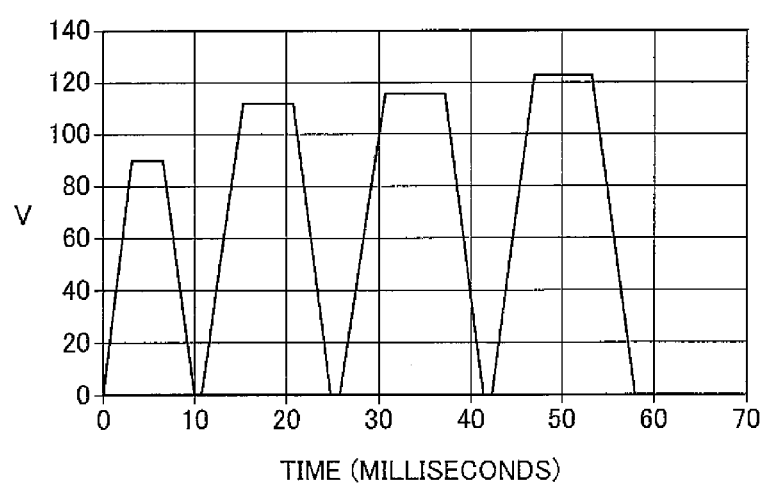
FIG. 10 is a plot of voltage vs. time for a drive signal containing a number of multipulse waveforms.

FIG. 8 is a graph showing an exemplary bipolar waveform for driving the ink-jet head. FIG. 9 is a graph showing an exemplary unipolar waveform for driving the ink-jet head. FIG. 10 is a plot of voltage vs. time for a drive signal containing a number of multipulse waveforms. FIGS. 11A to 11E are schematic diagrams each showing an example of the ejection of ink from an orifice in the ejecting portion in response to a multipulse waveform.

The drive method to be applied to the present invention is different from the conventional method which depends on a single drive pulse for ejecting a single drop of a desired volume through an orifice of a predetermined size and it enables a drop of the same volume to be ejected through an orifice of a smaller size in response to a plurality of drive pulses.

To be more specific, according to the ink-jet head drive method under consideration, a multipulse waveform containing two or more drive pulses is applied to the piezoelectric device so that one, namely, a single ink drop is ejected from one ejecting portion in the ink-jet head, with the drive pulse frequency being greater than the natural frequency, $f_j$, of the ink-jet head (ejecting portion).

An example of the multipulse waveform to be used in the drive method under consideration is depicted in FIG. 8. While FIG. 8 refers to the case where a multipulse waveform consists of four drive pulses, it may be composed of two or three drive pulses or even five or more drive pulses. It should also be noted that FIG. 8 refers to the case where each drive pulse consists of a bipolar waveform represented by normalized voltage (V/Vmax) and normalized time.

The drive pulse frequency is preferably higher than the natural frequency, $f_j$, of the ejecting portion; for example, it is preferably 1.3 times $f_j$ or greater, more preferably 1.5 times $f_j$ or greater, even more preferably between 1.5 and 2.5 times $f_j$, and most preferably between 1.8 and 2.2 times $f_j$.

The plurality of drive pulses may be pulses having the same pulse period or pulses having different pulse periods.

The plurality of drive pulses may consist of bipolar pulses having a negative (−) component Sm and a positive (+) component Sp as shown in FIG. 8, or may consist of unipolar pulses having only a positive (+) component as shown in FIG. 9; alternatively, they may consist of unipolar pulses having only a negative (−) component; if desired, they may consist of both positive (+) and negative (−) unipolar pulses, or they may even be mixed pulses comprising not only such positive and negative unipolar pulses but also bipolar pulses. The periods of drive pulses, tp, may be the same or different.

The amplitudes of respective drive pulses which correspond to a maximum or minimum voltage applied to the ejecting portion may be substantially the same or different but it is preferred that any drive pulse have a greater amplitude than earlier drive pulses.

In the preferred drive method, in order to ensure that the droplet ejecting device ejects a single droplet in response to a plurality of pulses, it is preferred to use a waveform comprising one or more pulses each having a period not longer than 20 microseconds, more preferably not longer than 12 microseconds, and even more preferably not longer than 10 microseconds.

In addition, to ensure that the droplet ejecting device ejects a single droplet of a fluid in response to two or more pulses, it is preferred to use a multipulse waveform comprising two or more pulses each having a period not longer than about 25 microseconds, more preferably not longer than 12 microseconds, even more preferably not longer than 8 microseconds, and most preferably not longer than 5 microseconds.

Droplets preferably have a mass between 1 picoliter and 100 picoliters, more preferably between 5 picoliters and 200 picoliters, and even more preferably between 50 picoliters and 1,000 picoliters.

In the drive method described above, the harmonic components of a plurality of drive pulses at the natural frequency $f_j$ of the ejecting portion are 50% or less, more preferably 25% or less, and even more preferably 10% or less, of the harmonic components of the plurality of drive pulses at $f_{max}$ which is the frequency of the maximum component.

In the drive method described above, it is preferred that at least 60% of the droplet's mass be included within the radius, r, of a point in the droplet, where r corresponds to the radius of a perfectly spherical droplet which is given by the following formula:

$$r = \sqrt[3]{\frac{3m_d}{4\pi\rho}}$$

where $m_d$ is the droplet's mass and $\rho$ is the fluid's density.

In the case under consideration, the droplet preferably has a velocity of at least 4 ms$^{-1}$, more preferably at least 6 ms$^{-1}$, and even more preferably at least 8 ms$^{-1}$. It is preferred that at least 80%, more preferably at least 90%, of the droplet's mass be included within the above-defined sphere.

In the drive method under consideration, the multipulse waveform is typically composed of continuous pulses but it may include discontinuous pulses.

During printing with the ink-jet head, a number of droplets are ejected from the respective ejecting portions by driving them with a number of multipulse waveforms. As shown in FIG. 9, multipulse waveforms 210 and 220 are respectively followed by delay periods 212 and 222 so that the multipulse waveform 210 is separated from the multipulse waveform 220 and the latter from the subsequent multipulse waveform. One droplet is ejected in response to the multipulse waveform 210 and another droplet is ejected in response to the multipulse waveform 220. The multipulse waveforms 210 and 220 each consist of four drive pulses as shown in FIG. 8 but they may each consist of no more than three drive pulses or at least five drive pulses; on the other hand, the delay period 212 or 222 is preferably longer than the total period of the multipulse waveform 210 or 220 (the total period being the sum of four drive pulses), at least twice the total period of one multipulse waveform, with an integral multiple of that total period (the integer≥2) being particularly preferred.

Described below are the growth and ejection of a single ink droplet in response to a multipulse waveform consisting of a plurality of drive pulses in the drive method under consideration.

FIGS. 11A to 11E are schematic diagrams showing the growth and ejection of a single ink droplet in response to a multipulse waveform.

As these figures show, the volume of a single ink droplet which is to be ejected from the ejecting portion in response to a multipulse waveform that consists of a plurality of drive pulses increases progressively with the application of the next drive pulse and eventually the droplet is separated and ejected as a single ink droplet.

First, prior to the application of an initial drive pulse, the ink within the ink reservoir 68 (see FIG. 7) forms a meniscus 74 curved slightly backward from the orifice 72 of a nozzle 70 under the internal pressure (see FIG. 11A).

If the orifice 72 is circular in cross section, D represents its diameter. Here the diameter D can be determined by the ink-jet design and droplet size requirements. For example, the diameter D can be set somewhere between about 10 μm and 200 μm, preferably between about 20 μm and 50 μm. The initial pulse pushes out a first predetermined volume of ink through the orifice 72, causing an ink surface 80 to protrude slightly from the nozzle 70 (see FIG. 11B).

Before the first part of the ejected droplet separates or contracts, a second pulse pushes out another predetermined volume of ink through the orifice 72, which is added to the ink already protruding from the nozzle 70. In this way, the volume of the ink protruding from the nozzle 70 increases and the ink droplet grows. The ink pushed out in response to the second pulse and the ink pushed out in response to a third pulse each contribute to increasing the volume of the ink droplet and adding a momentum, as shown in FIGS. 11C and 11D. Thus, the ink volume increases upon application of continuous drive pulses and, as shown in FIGS. 11C and 11D, the droplet that is being formed in the orifice 72 bulges out.

Finally, upon application of a fourth drive pulse, the nozzle 70 ejects one, or a single, ink droplet 84 and the meniscus 74 returns to its initial position (see FIGS. 11E and 11A). FIG. 11E also shows an extremely thin tail 86 that connects the ink droplet head to the nozzle 70. The size of the tail is substantially smaller than would occur in droplets that are formed using the conventionally known single pulse and a larger nozzle.

To be more specific, by applying the drive method under consideration and assuming that the same single ink droplet is to be ejected, the size of a nozzle, for example, the orifice diameter through which an ink droplet is ejected in response to the conventionally known single pulse can be substantially reduced. For example, in the case of using a multipulse waveform consisting of four drive pulses, the nozzle size can be reduced to about a quarter of the conventional size. What is more, the drive method under consideration can minimize the tail of an ejected ink droplet. As a result, the drive method under consideration offers the advantage of preventing the tiny separated droplets such as satellites or splashes that would otherwise occur from the tails of ink droplets.

Described above are the basic features of the drive method that is applicable to the ink-jet head of the present invention.

Figure 12:
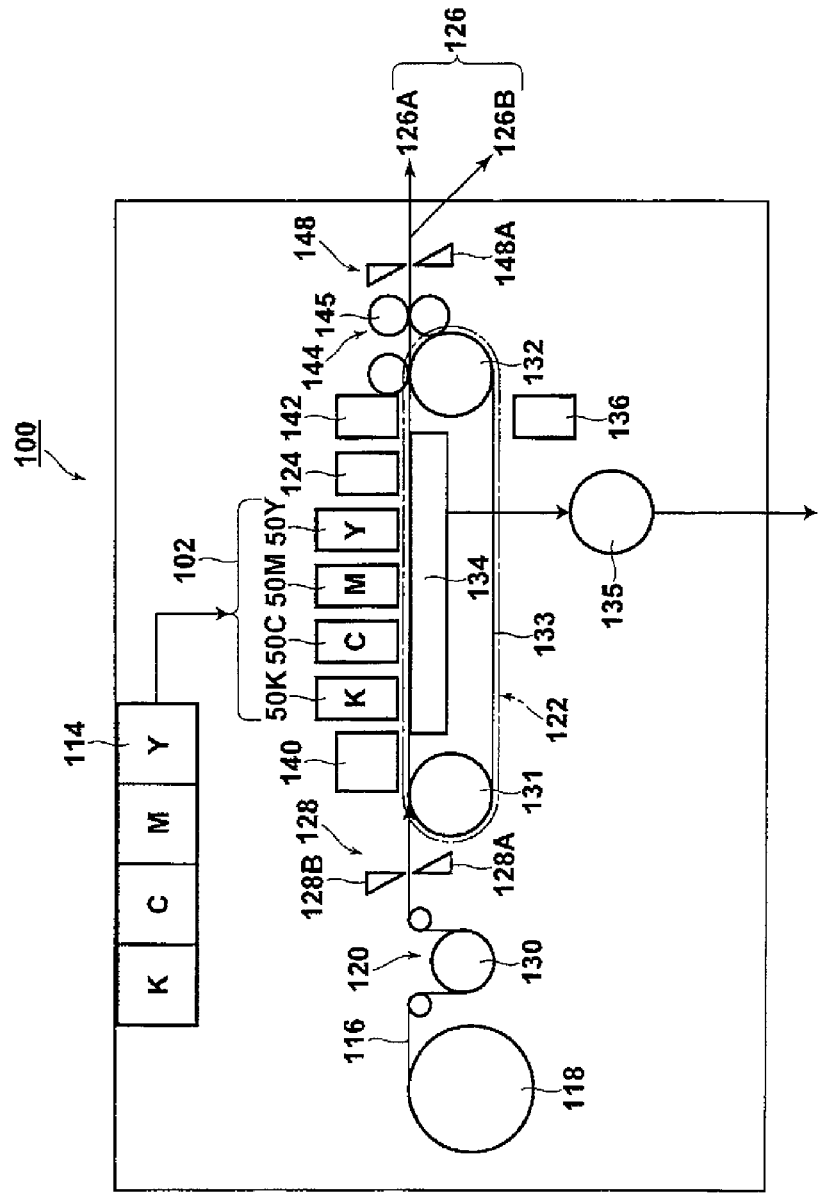
FIG. 12 is a system layout showing the structure of an embodiment of an ink-jet recording apparatus equipped with the ink-jet head shown in FIG. 7.
Figure 13:
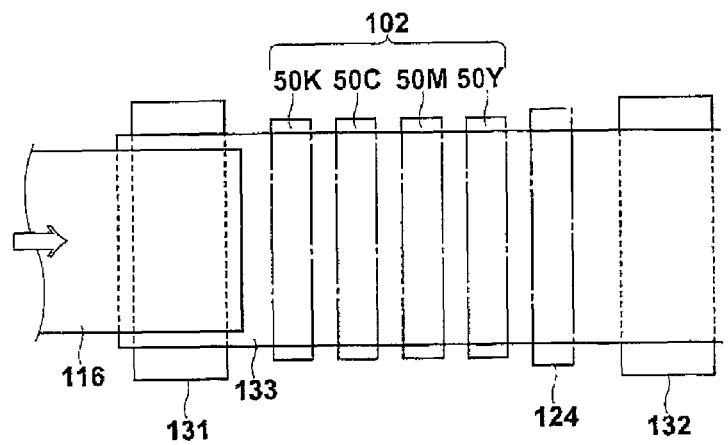
FIG. 13 is a partial top view of the ink-jet recording apparatus shown in FIG. 12.

We now describe the construction of an ink-jet recording apparatus that is equipped with the ink-jet head according to the present invention. FIG. 12 is an overall system view showing the general layout of an embodiment of an ink-jet recording apparatus equipped with the ink-jet head of the present invention, and FIG. 13 is a partial top view of the ink-jet recording apparatus shown in FIG. 12.

The illustrated ink-jet recording apparatus which is generally indicated by 100 basically includes a printing unit 102 having a plurality of ink-jet heads (which are hereinafter referred to simply as "heads") 50K, 50C, 50M and 50Y that are classified by ink color, ink storing/filling units 114 for storing the inks to be supplied to the respective heads 50K, 50C, 50M and 50Y, a paper feed unit 118 for supplying recording paper 116, a decurling unit 120 for removing any curl from the recording paper 116, a suction belt transport unit 122 that is placed in a face-to-face relationship with the nozzle tips (ink ejecting surface) of the printing unit 102 and which transports the recording paper 116 while maintaining its flatness, a print detecting unit 124 which reads the result of printing with the printing unit 102, and a paper ejecting unit 126 by means of which the printed recording paper (printed matter) is ejected to the outside.

Each of the heads 50K, 50C, 50M and 50Y that constitute the printing unit 102 is the ink-jet head 50 according to the above-described embodiment (see FIG. 7).

In the decurling unit 120, a heating drum 130 applies heat to the recording paper 116 in a direction opposite the direction in which the paper has been rolled and the heat thus applied effectively removes the curl.

In an apparatus that uses a roll of paper, a cutter 128 is provided downstream of the decurling unit 120 and it is by means of this cutter that the roll of paper is cut to a desired size. The cutter 128 comprises a fixed blade 128A whose length is at least equal to the width of the transport path for the recording paper 116 and a circular blade 128B that moves along the fixed blade 128A; the fixed blade 128A is provided on the side away from the print side whereas the circular blade 128B is provided on the print side which is the other side of the transport path. The cutter 128 need not be provided in an apparatus that uses cut sheets of paper.

The decurled and cut recording paper 116 is sent to the suction belt transport unit 122. The suction belt transport unit 122 is of such a structure that an endless belt 133 is stretched between rollers 131 and 132 and at least the portion of that unit which is in a face-to-face relationship with the nozzle tips of the printing unit 102 and the sensor side of the print detecting unit 124 forms a level (flat) surface.

The belt 133 has a greater width dimension than the recording paper 116 and has a number of suction holes (not shown) bored through its thickness. Inside the belt 133 which is stretched between the rollers 131 and 132 and in a position that faces the nozzle tips of the printing unit 102 and the sensor side of the print detecting unit 124, there is provided a suction chamber 134 which is aspirated with a fan 135 to create a negative pressure that sucks the recording paper 116 on the belt 133 and holds it in position.

The power of a motor (not shown) is transmitted to at least one of the rollers 131 and 132 between which the belt 133 is stretched, whereupon the belt 133 is driven clockwise as seen in FIG. 12 and the recording paper 116 held on the belt 133 is transported from left to right in FIG. 12.

Note that if a borderless print or the like is made, ink also adheres onto the belt 133, so in order to deal with this problem, a belt cleaning unit 136 is provided outside the belt 133 and in a predetermined position (any appropriate position other than the print region).

Above the recording paper transport path that is formed of the suction belt transport unit 122, a heating fan 140 is provided upstream of the printing unit 102. The heating fan 140 blows heated air onto the recording paper 116 before printing and heats it. Heating the recording paper 116 just before printing contributes to making the ink quicker to dry after it is landed on the recording paper 116.

The printing unit 102 is composed of "full-line" heads, or linear heads each having a length corresponding to the maximum paper width and being arranged in a main scanning direction, or a direction perpendicular to the direction of paper feed (see FIG. 13). Each of the heads 50K, 50C, 50M and 50Y is composed of a linear head in which a plurality of ink orifices (nozzles) are arranged to extend over a length that exceeds at least one side of the recording paper 116 of the largest size that the ink-jet recording apparatus 100 can handle.

Arranged from upstream to downstream direction of the feed of the recording paper 116 are the heads 50K, 50C, 50M and 50Y, in that order, which are associated with inks of respective colors of black (K), cyan (C), magenta (M) and yellow (Y). As the recording paper 116 is transported, the heads 50K, 50C, 50M and 50Y eject inks of their associated colors to record a color image on the recording paper 116.

The print detecting unit 124 comprises a line sensor or the like which images the result of droplet deposition from the printing unit 102, and based on the droplet-deposited image as read by the line sensor, the unit 124 detects any defect in ejection such as nozzle clogging.

Provided downstream of the print detecting unit 124 is a post-drying unit 142 that typically comprises a heating fan for drying the printed image surface. Since contact with the print surface is preferably avoided until after the printed ink has dried up, blowing hot air against the print surface is a preferred drying method.

Provided downstream of the post-drying unit 142 is a heating/pressing unit 144 for controlling the gloss of the image surface. In the heating/pressing unit 144, the image surface, while it is heated, is pressed by a press roller 145 having predetermined surface asperities so that the surface asperities are transferred to the image surface.

The printed matter thus obtained is ejected from the paper ejecting unit 126. The image to be printed (i.e., the print of the desired image) is preferably ejected as a separate article from a test print. The ink-jet recording apparatus 100 under consideration is provided with a selector means (not shown) that selects between the print of the desired image and the test print and which switches the paper ejecting path such that it guides the print of the desired image to an ejector 126A and the test print to another ejector 126B.

In the case where the print of the desired image and the test print are simultaneously made side by side on a larger size of recording paper, a cutter 148 may be provided to cut off the portion of the paper on which the test print has been made.

Described above is the basic construction of the ink-jet recording apparatus according to the embodiment under consideration.

While the sputtering method and apparatus according to the present invention, as well as thin films such as piezoelectric films, insulating films and dielectric films that are deposited by the method and apparatus, thin-film devices such as piezoelectric devices using the piezoelectric films, the ink-jet head equipped with the piezoelectric device, and the ink-jet recording apparatus equipped with the ink-jet head have been described on the foregoing pages in detail with reference to various embodiments, it should be understood that the present invention is by no means limited to those embodiments and various improvements and design changes may of course be made without departing from the spirit and scope of the invention.

EXAMPLES

On the following pages, the present invention is described specifically with reference to working examples.

Example 1

Model STV 4320 of Shinko Seiki Co., Ltd. was used as the sputtering apparatus 10 shown in FIGS. 1 and 2. In this sputtering apparatus 10, the substrate holder 18 was of such a design as to permit selection between the grounded state and a floating state. The RF power source 16 was capable of applying RF power of up to 1 kW.

The sputtering apparatus 10 shown in FIGS. 1 and 2 used the impedance adjusting circuit 20 as shown in FIG. 3 and it was connected to the substrate holder 18.

A 4-inch size of sintered compact with the composition $Pb_{1.3}Zr_{0.52}Ti_{0.48}O_x$ was used as the target material TG. The substrate SB measured 5 cm by square and had Ti and Ir preliminarily formed in respective thicknesses of 10 nm and 150 nm on a Si wafer.

The target material TG and the substrate SB were spaced apart by 60 mm.

With the substrate temperature set at 525° C., a gas mixture of Ar and $O_2$ (2.5%) was introduced to deposit a PZT film at 0.5 Pa.

With the substrate potential being monitored during film deposition, the impedance of the impedance circuit 22 in the impedance adjusting circuit 20 was adjusted.

Note that the impedance circuit 22 was capable of varying the phase of radio frequency waves (RF) from zero to ±180 degrees and the transmittance of radio frequency waves (RE) from zero to unity.

The relationship between the substrate potential Vf as measured when the impedance of the impedance circuit 22 was adjusted and the crystal phase of the films deposited with such varying substrate potential is shown in Table 1 below. Through adjustment of its impedance, the impedance circuit 22 was capable of adjusting the substrate potential Vf from −10 volts up to 20 volts.

TABLE 1

|  | Vf(V) | Structure of deposited film |
| --- | --- | --- |
| Ground potential | 0 | pyrochlore phase + perovskite phase |
| Condition 1 | 5 | pyrochlore phase + perovskite phase |
| Condition 2 | 10 | pyrochlore phase + perovskite phase |
| Condition 3 | 12 | perovskite phase |
| Condition 4 | 18 | perovskite phase |
| Condition 5 | 20 | perovskite phase |
| Condition 6 | −10 | pyrochlore phase + perovskite phase |

As is clear from Table 1, it was possible in Example 1 to adjust the substrate potential Vf by adjusting the impedance of the impedance circuit 22 in the impedance adjusting circuit 20 and, as a result, the structure of the deposited film could be changed in accordance with the substrate potential Vf. It is therefore clear that in a working example of the present invention, the film quality can be controlled by changing the impedance of the impedance circuit 22.

It should be particularly noted that when the substrate potential Vt was adjusted from −10 volts up to 10 volts by changing the impedance of the impedance circuit 22, one could deposit PZT films having both the perovskite and the pyrochlore phase but that when the substrate potential Vf was adjusted to 12 volts and above, one could deposit preferred PZT films consisting of only the perovskite phase.

Comparative Example 1

An experiment was conducted as in Example 1, except that the target material TG and the substrate SB were spaced apart by 12 cm and that the substrate potential Vf was adjusted at 10 or 11 volts.

The results are shown in Table 2 below.

TABLE 2

|  | Vf(V) | Structure of deposited film |
|---|---|---|
| Condition 7 | 10 | pyrochlore phase + perovskite phase |
| Condition 8 | 10 | pyrochlore phase + perovskite phase |
| Condition 9 | 10 | pyrochlore phase + perovskite phase |
| Condition 10 | 10 | pyrochlore phase + perovskite phase |
| Condition 11 | 11 | pyrochlore phase + perovskite phase |

As is clear from Table 2, the substrate potential Vf remained substantially unchanged in Comparative Example 1, so the structures of the deposited films were virtually the same. As the result, the film quality was obviously impossible to control.

When the distance between the substrate SB and the target material TG was great, the substrate potential Vf did not change probably because the substrate SB was too far away from the place where a plasma was generated. It should also be noted that since the substrate potential Vf was either 10 or 11 volts, all PZT films that could be deposited had both the pyrochlore and the perovskite phase.

Example 2

More than one batch of film deposition was performed for two cases, one where the substrate potential Vf was adjusted and the other where it was not. The results are shown in Table 3 below.

TABLE 3

|  | Vf (adjusted) | Vf (not adjusted) |
|---|---|---|
| Batch 1 | 10 | 10 |
| Batch 5 | 10 | 11 |
| Batch 10 | 10 | 13 |
|  | Cleaned |  |
| Batch 1 | 10 | 10 |

As is clear from Table 3, the potential Vf of the substrate SB could be held constant in Example 2 by adjusting it but when it was not adjusted, the potential of the substrate SB changed gradually. In the absence of adjustment, an insulating film may have formed near the substrate holder 18 or on the side walls of the vacuum vessel 12, causing the plasma state and, hence, the potential of the substrate SB to change. On the other hand, adjustment must have enabled film deposition to occur at a constant potential.

Therefore, by adjusting it, the substrate potential Vf can be held at a constant value or within a predetermined range to prevent a change in film quality, thus enabling piezoelectric films to be deposited with the same quality. Even in the case where the substrate potential Vf is not adjusted based on the preliminarily determined range of substrate potential Vf required to obtain thin films of the same quality, changes in Vf may be monitored to detect a departure from the predetermined range, or alternatively, the film quality may be found to have deteriorated or the substrate potential Vf may be impossible to adjust such that it lies within the predetermined range; in either of these situations, the operator can see it is the time to clean the interior of the vacuum vessel 12. In this case, the "time to clean" is preferably displayed on the cleaning time display section 26b of the display unit 26 in the impedance adjusting circuit 20.

Thereafter, the sputtering apparatus 10, in particular, the interior of the vacuum vessel 12 is cleaned to ensure the preparation of more piezoelectric films of the same quality.

This result shows that the present invention can be applied to improve the stability of the sputtering apparatus or as a monitor for the production of thin films such as piezoelectric, insulating or dielectric films by sputtering.

Example 3

Two kinds of piezoelectric film, one being made of PZT and the other of Nb-doped PZT, were deposited from target materials $Pb_{1.3}Zr_{0.52}T_{0.48}O_3$ and $Pb_{1.3}Zr_{0.43}Ti_{0.44}Nb_{0.13}O_3$ with the sputtering apparatus 10 shown in FIGS. 1 and 2 under such conditions that the degree of vacuum was 0.5 Pa and that the atmosphere was an $Ar/O_2$ mixture ($O_2$ volume fraction: 2.5%). In the following description, Nb-doped PZT is abbreviated as Nb-PZT.

A substrate with electrode, comprising a Si wafer having a 30-μm thick Ti adherent layer and a 150-nm thick lower Pt electrode superposed on it in that order, was provided as the substrate SB for film deposition. The distance between the substrate SB and the target material TG was set at 60 mm.

For film deposition, the potential Vf (V) of the substrate SB in a floating state was adjusted by varying the impedance of the substrate holder 18 with the impedance adjusting circuit 20. In the meantime, the plasma potential Vs was measured and the potential difference Vs–Vf was found to be about 12 volts.

Under the plasma condition described above, the film deposition temperature Ts was varied within the range of 450 to 600° C. for depositing films. At Ts=525° C., a Nb-PZT film was deposited and at film deposition temperatures other than 525° C., PZT films were deposited. The films obtained were subjected to X-ray diffractometry (XRD). The XRD patterns of typical film samples are shown in FIG. 14.

Note that the objective of the experiment conducted in Example 3 was to obtain PZT-based piezoelectric films having a perovskite crystal structure.

Figure 14:
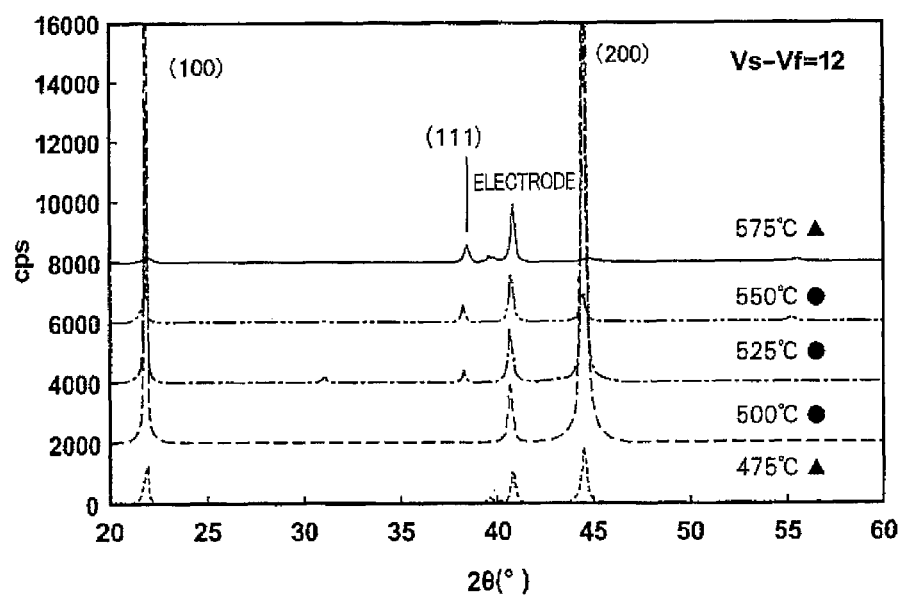
FIG. 14 is a graph showing XRD patterns of major piezoelectric films that were prepared in EXAMPLE 3.

As FIG. 14 shows, under the condition where the potential difference Vs–Vf was about 12 volts, perovskite crystals having crystal orientation were obtained within the film deposition temperature Ts ranging from 475° C. to 575° C. At Ts=450° C., a film consisting mainly of the pyrochlore phase was obtained and the result was rated × (not shown). At Ts=475° C., the result was rated ▲ since other samples prepared under the same conditions were found to have the pyrochlore phase. At Ts =575° C., orientation started to be upset, so the result at that temperature was rated ▲ and the result at Ts=600° C. was rated × (not shown). At Ts within the range of 500 to 550° C., perovskite crystals having satisfactory crystal orientation were obtained consistently, so the results were rated ●.

Figure 15:
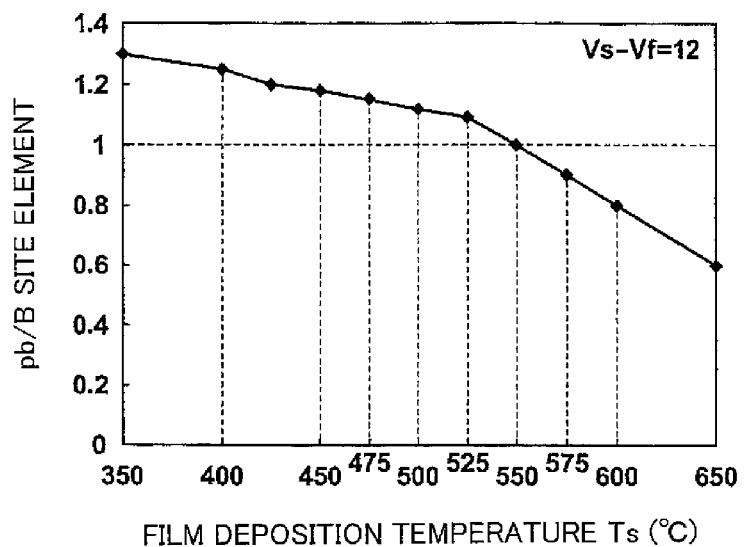
FIG. 15 is a graph showing the results of compositional analyses of the piezoelectric films prepared in EXAMPLE 3.

Each of the piezoelectric films obtained was subjected to compositional analysis by XRF and the results are shown in FIG. 15. The legend "Pb/B site element" on the vertical axis of the graph in FIG. 15 refers to the ratio of the molar amount of Pb to the total molar amount of elements at B site (Zr+Ti or Zr+Ti+Nb).

As FIG. 15 shows, under the condition where the potential difference Vs–Vf was about 12 volts, there could be deposited Pb-loss free PZT films or Nb-PZT films that were both characterized by 1.0≤Pb/B site element≤1.3, when the film deposition temperature Ts was in the range of 350 to 550° C. It should, however, be noted that at Ts of 450° C. and below, the film deposition temperature was too low for perovskite crystals to grow. At Ts of 600° C. and above, Pb loss prevented the growth of perovskite crystals.

For example, the Nb-PZT film deposited under such conditions that the potential difference Vs–Vf was about 12 volts and that the film deposition temperature Ts was 525° C. had the composition $Pb_{1.12}Zr_{0.43}Ti_{0.44}Nb_{0.13}O_3$.

On this piezoelectric film sample of $Pb_{1.12}Zr_{0.43}Ti_{0.44}Nb_{0.13}O_3$, an upper Pt electrode was formed in a thickness of 100 nm by sputtering. The piezoelectric constant $d_{31}$ of this piezoelectric film was measured by a cantilever method to give a satisfactorily high value of 250 pm/V.

Example 4

For film deposition, the substrate potential Vf (V) of the substrate SB in a floating state was adjusted by varying the impedance of the substrate holder 18 with the impedance adjusting circuit 20 to have different values than in Example 3 so that the plasma state within the sputtering apparatus 10 would become different than in Example 3. In the meantime, the plasma potential Vs was measured as in Example 3 and the potential difference Vs–Vf was found to be about 42 volts. Under the plasma condition just described above, the film deposition temperature Ts was varied within the range of 380 to 500° C. for depositing PZT films and the films obtained were subjected to X-ray diffractometry (XRD). The XRD patterns of typical film samples are shown in FIG. 16.

Figure 16:
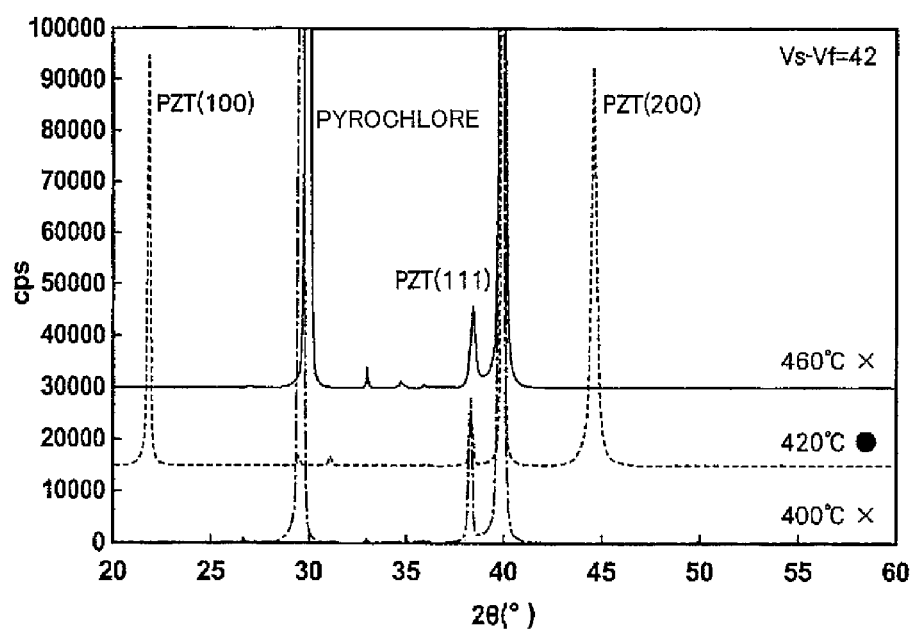
FIG. 16 is a graph showing XRD patterns of major piezoelectric films that were prepared in EXAMPLE 4.

As FIG. 16 shows, under the condition where the potential difference Vs–Vf was about 42 volts, perovskite crystals having satisfactory crystal orientation were obtained at Ts=420° C., so the result was rated ●. At Ts=400° C. and below as well as at Ts=460° C. and above, films mainly consisting of the pyrochlore phase were obtained, so the results were rated ×.

Figure 17:
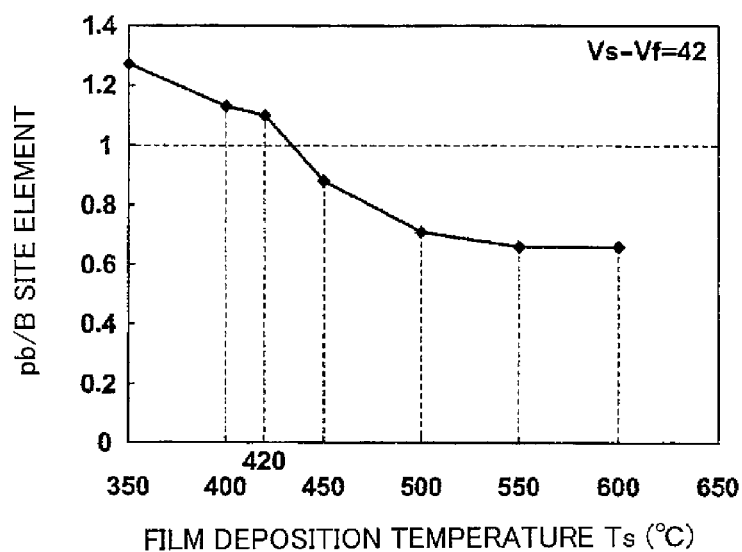
FIG. 17 is a graph showing the results of compositional analyses of the piezoelectric films prepared in EXAMPLE 4.

Each of the PZT films obtained was subjected to compositional analysis by XRF as in Example 3 and the results are shown in FIG. 17. As FIG. 17 shows, under the condition where the potential difference Vs–Vf was about 42 volts, there could be deposited Pb-loss free PZT films that were characterized by 1.0≤Pb/B site element≤1.3, when the film deposition temperature Ts was in the range of from 350° C. to less than 450° C. It should, however, be noted that at Ts of 400° C. and below, the film deposition temperature was too low for perovskite crystals to grow.

Example 5

For depositing PZT or Nb-PZT films, the potential difference Vs–Vf (V) was changed by varying the potential Vf (V) of the substrate SB in a floating state by adjusting the impedance of the substrate holder 18 with the impedance adjusting circuit 20 and the films obtained were evaluated by the same procedures as in Example 4. For each of the Vs–Vf values of about 12, 22, 32, 42, 45 and 50 volts, films were deposited at varying film deposition temperatures Ts. Throughout Examples 3 to 5, Nb-PZT films were the samples deposited when Ts was 525° C. and Vs–Vf was about 12, 32 and 45 volts whereas the samples deposited under the other conditions were PZT films.

Figure 18:
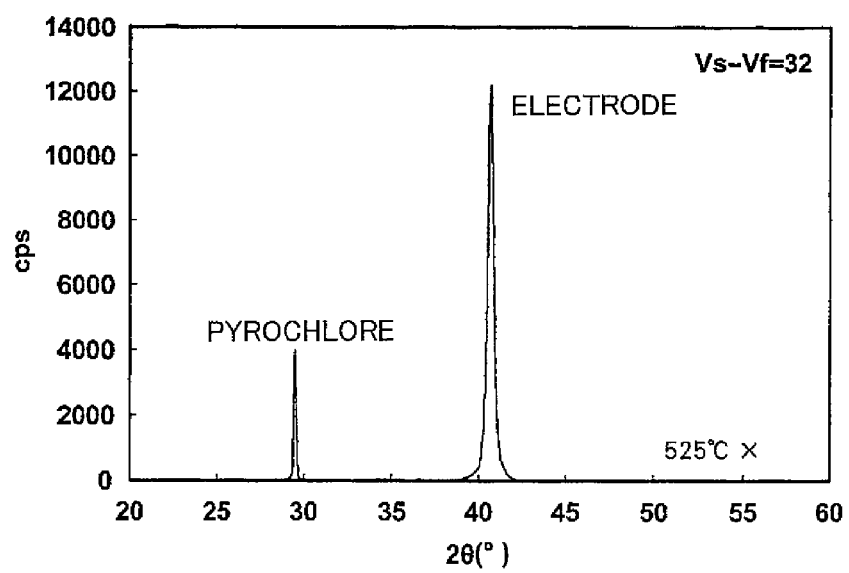
FIG. 18 is a graph showing XRD patterns of piezoelectric films that were deposited in EXAMPLE 5 under such conditions that the potential difference Vs−Vf was about 32 volts and the film deposition temperature Ts was 525° C.

The XRD pattern of the sample which was rated × in terms of the result of XRD measurement is shown in FIG. 18. The sample illustrated in FIG. 18 was a Nb-PZT film that was deposited under such conditions that Vs–Vf was about 32 volts and Ts was 525° C.

FIG. 19 is a graph showing the results of XRD measurement on all samples of Examples 3 to 5, with the film deposition temperature Ts being plotted on the horizontal axis and the potential difference Vs–Vf on the vertical axis. Two straight lines are drawn in FIG. 19, one representing Vs–Vf=−0.2 Ts+100 and the other for Vs–Vf=−0.2 Ts+130.

FIG. 19 shows that by determining the conditions for depositing PZT or Nb-PZT films to lie within a range that satisfies the following relations (1) and (2):

$$Ts(°C.) \geq 400 \qquad (1)$$

$$-0.2Ts+100 < Vs-Vf(V) < -0.2Ts+130 \qquad (2)$$

perovskite crystals with a smaller content of the pyrochlore phase can be grown consistently and yet Pb loss can be suppressed consistently, thereby ensuring that piezoelectric films of good quality having a satisfactory crystal structure and film composition can be deposited consistently.

The sputtering apparatus and method of the present invention can be applied in depositing thin films such as piezoelectric, insulating and dielectric films by plasma-enhanced vapor-phase growth techniques such as sputtering and, in particular, they are applicable in depositing piezoelectric films that are to be employed in ink-jet recording heads, ferroelectric memories (FRAMs), and pressure sensors.

What is claimed is:

1. A sputtering method comprising the steps of:
   holding a target material to be sputtered on a sputter electrode placed within a vacuum vessel and also holding a substrate on a substrate holder placed within said vacuum vessel in a face-to-face relationship with said sputter electrode; and
   applying radio frequency waves to said sputter electrode from a radio frequency power source connected to said sputter electrode, whereby said target material is sputtered to form a thin film on a surface of said substrate from components of the target material,
   wherein a DC component of a potential difference between a substrate potential of said substrate and a ground potential is measured with a detector circuit provided in an impedance adjusting circuit one end of which is directly set at the ground potential, and
   wherein the result of detection with said detector circuit is displayed, the thus displayed result of detection is monitored,
   whereas a first impedance of said substrate holder is adjusted by adjusting a second impedance of an impedance circuit provided in said impedance adjusting circuit by control knobs from outside depending upon the displayed result of detection of the DC component with said detector circuit connected to said impedance circuit so as to adjust said substrate potential to 10V or higher for depositing the thin film on the surface of said substrate,
   wherein the thin film is a piezoelectric film, and
   wherein said piezoelectric film comprises one or more of perovskite oxides represented by the formula (P), a deposition temperature Ts (° C.) of said piezoelectric film is 400° C. or higher, and a differential potential Vs−Vf (V) that is a difference between a plasma potential Vs(V) during film deposition and a potential of said substrate Vf (V) satisfies following relations (1) and (2):

$$A_aB_bO_3 \quad (P),$$

where A is an element at site A which is at least one member of the group including Pb;

B is an element at site B which is at least one member selected from the group consisting of Ti, Zr, V, Nb, Ta, Cr, Mo, W, Mn, Sc, Co, Cu, In, Sn, Ga, Zn, Cd, Fe, Ni, and lanthanides; O is an oxygen atom; a and b are each 1.0, $$-0.2Ts+100 < Vs-Vf(V) < -0.2Ts+130 \quad (1), \text{ and}$$

$$12 \leq Vs-Vf(V) \leq 35 \quad (2).$$

2. The sputtering method according to claim 1, wherein a distance between said target material held on said sputter electrode and said substrate held on said substrate holder is 10 cm or smaller.

3. The sputtering method according to claim 2, wherein the distance is 2 cm or greater and 10 cm or smaller.

4. The sputtering method according to claim 1, wherein the thin film is an insulating film or a dielectric film.

5. A sputtering method according to claim 1, wherein said control knobs comprises a first control knob and a second control knob, said impedance circuit comprises a first variable capacitor and a second variable capacitor that are connected in parallel to each other, and a coil connected in series to the second variable capacitor, a junction of one end of the first variable capacitor and one end of coil being connected to the substrate holder, the other end of the first variable capacitor and the other end of the second variable capacitor being grounded, and said first control knob and said second control knob adjust electrostatic capacities of the first variable capacitor and the second variable capacitor, respectively, to adjust the impedance of the impedance circuit.

\* \* \* \* \*